US010728450B2

(12) United States Patent
Govil et al.

(10) Patent No.: US 10,728,450 B2
(45) Date of Patent: Jul. 28, 2020

(54) EVENT BASED COMPUTER VISION COMPUTATION

(71) Applicant: QUALCOMM Incorporated, San Diego, CA (US)

(72) Inventors: Alok Govil, Fremont, CA (US); Soo Youn Kim, San Diego, CA (US); Evgeni Petrovich Gousev, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 14/859,146

(22) Filed: Sep. 18, 2015

(65) Prior Publication Data

US 2016/0094787 A1    Mar. 31, 2016

Related U.S. Application Data

(60) Provisional application No. 62/057,927, filed on Sep. 30, 2014.

(51) Int. Cl.
*H04N 5/232* (2006.01)
*H01L 27/146* (2006.01)
(Continued)

(52) U.S. Cl.
CPC ....... *H04N 5/23241* (2013.01); *G06F 3/0425* (2013.01); *G06K 9/00986* (2013.01);
(Continued)

(58) Field of Classification Search
CPC .. H04N 5/23241; H04N 5/3745; H04N 5/378; G06K 9/00986; G06K 2009/4666;
(Continued)

(56) References Cited

U.S. PATENT DOCUMENTS 5,543,590 A    8/1996 Gillespie et al.
6,011,257 A    1/2000 Endoh
(Continued)

FOREIGN PATENT DOCUMENTS

CN    102663409 A    9/2012
CN    103259985 A    8/2013
(Continued)

OTHER PUBLICATIONS

El Gamal et al., "Pixel Level Processing—Why, What, and How?" Proc. of the SPIE Electronic Imaging '99 conference, 1999.*
(Continued)

*Primary Examiner* — Nelson D. Hernández Hernández
(74) *Attorney, Agent, or Firm* — Kilpatrick Townsend & Stockton/QUALCOMM Incorporated

(57) ABSTRACT

Certain techniques are provided for triggering events based on detecting changes in CV features, such as edges, corners etc., by generating computed results based on sensor readings. Yet other techniques also provided for detecting CV features once an event is detecting based on a change in a sensor reading for a sensor element. In certain aspects, the event detection logic and the feature calculation CV vision operations may be performed, individually, or in combination in circuitry on a sensor or in software/firmware on a computing device.

18 Claims, 19 Drawing Sheets

(51) Int. Cl.

| | | |
|---|---|---|
| *H04N 5/3745* | (2011.01) | |
| *G06K 9/00* | (2006.01) | |
| *G06F 3/042* | (2006.01) | |
| *G06K 9/46* | (2006.01) | |
| *H04N 5/378* | (2011.01) | |

(52) U.S. Cl.
CPC ....... *H01L 27/14643* (2013.01); *H04N 5/378* (2013.01); *H04N 5/3745* (2013.01); *G06K 2009/4666* (2013.01)

(58) Field of Classification Search
CPC . G06F 1/3203; G06F 3/0304; H01L 27/14643
See application file for complete search history.

(56) References Cited

U.S. PATENT DOCUMENTS

| | | | |
|---|---|---|---|
| 7,038,185 | B1 | 5/2006 | Tumblin et al. |
| 7,151,844 | B2 | 12/2006 | Stevenson et al. |
| 8,462,996 | B2 | 6/2013 | Moon et al. |
| 8,902,971 | B2 | 12/2014 | Pace et al. |
| 8,928,793 | B2 | 1/2015 | McMahon |
| 9,030,445 | B2 | 5/2015 | Shamaie |
| 2001/0028405 | A1 | 10/2001 | Kondo et al. |
| 2004/0155175 | A1 | 8/2004 | McNulty |
| 2006/0197664 | A1* | 9/2006 | Zhang ............... G06T 7/246 340/555 |
| 2009/0020612 | A1 | 1/2009 | Drzymala et al. |
| 2009/0157707 | A1 | 6/2009 | Ito et al. |
| 2010/0182468 | A1 | 7/2010 | Posch et al. |
| 2011/0128428 | A1 | 6/2011 | Takatoku et al. |
| 2011/0298755 | A1 | 12/2011 | Ni |
| 2012/0138774 | A1 | 6/2012 | Kelly et al. |
| 2012/0313960 | A1 | 12/2012 | Segawa et al. |
| 2013/0054505 | A1 | 2/2013 | Ross et al. |
| 2013/0121590 | A1 | 5/2013 | Yamanaka et al. |
| 2013/0176552 | A1 | 7/2013 | Brown et al. |
| 2014/0003663 | A1 | 1/2014 | Li et al. |
| 2014/0118592 | A1* | 5/2014 | Yoon ............... H04N 5/23245 348/308 |
| 2014/0125799 | A1 | 5/2014 | Bos et al. |
| 2014/0149754 | A1 | 5/2014 | Silva et al. |
| 2014/0169663 | A1* | 6/2014 | Han ............... G06K 9/00724 382/159 |
| 2014/0254864 | A1 | 9/2014 | Dalal et al. |
| 2014/0319325 | A1 | 10/2014 | Kawahito et al. |
| 2014/0320666 | A1 | 10/2014 | Badawy et al. |
| 2014/0363049 | A1 | 12/2014 | Benosman et al. |
| 2014/0368423 | A1 | 12/2014 | Brenckle et al. |
| 2014/0368626 | A1 | 12/2014 | John Archibald et al. |
| 2014/0368712 | A1* | 12/2014 | Park ............... H04N 5/3765 348/308 |
| 2015/0036942 | A1 | 2/2015 | Smirnov et al. |
| 2016/0014421 | A1* | 1/2016 | Cote ............... H04N 19/196 382/170 |
| 2016/0091946 | A1 | 3/2016 | Govil et al. |
| 2016/0094800 | A1 | 3/2016 | Gousev |
| 2017/0064211 | A1 | 3/2017 | Omid-Zohoor |

FOREIGN PATENT DOCUMENTS

| | | |
|---|---|---|
| DE | 102006023611 A1 | 11/2007 |
| DE | 102008052930 A1 | 4/2010 |
| EP | 2709066 A1 | 3/2014 |
| JP | 2008131407 A | 6/2008 |
| JP | 2009140149 A * | 6/2009 |
| JP | 2009140149 A | 6/2009 |
| JP | 2013003787 A | 1/2013 |
| WO | WO-2012093381 A1 | 7/2012 |
| WO | 2013052880 | 4/2013 |
| WO | WO-2014015194 A2 | 1/2014 |

OTHER PUBLICATIONS

Zhang et al., "A Programmable Vision Chip Based on Multiple Levels of Parallel Processors," IEEE Journal of Solid-state Circuits, vol. 46, No. 9, Sep. 2011.*
Gasparini et al., "A micro-power asynchronous contrast-based vision sensor wakes-up on motion," IEEE International Symposium on Circuits and Systems (ISCAS), 2008.*
Fekete et al., "Distributed Vision with Smart Pixels," SCG '09 Proceedings of the twenty-fifth annual symposium on Computational geometry, pp. 257-266, 2009.*
Cottini et al., "A 33 uW 64×64 Pixel Vision Sensor Embedding Robust Dynamic Background Subtraction for Event Detection and Scene Interpretation," IEEE Journal of Solid State Circuits, vol. 48, No. 3, Mar. 2013.*
Teixeira et al., "Address-Event Imagers for Sensor Networks: Evaluation and Modeling," ISPN06, Nashville, Tennessee, Apr. 19-21, 2006.*
Trein, J. et al., "Development of a FPGA Based Real-Time Blob Analysis Circuit", ISSC 2007, Derry, Sep. 13-14 (6 pages).
Chi, Y.M., et al., "CMOS Camera With In-Pixel Temporal Change Detection and ADC," IEEE Journal of Solid-State Circuits, Oct. 2007, vol. 42 , No. 10, pp. 2187-2196.
Choi, J., et al., "A 3.4[mu]W CMOS Image Sensor with Embedded Feature-extraction Algorithm for Motion-Triggered Object-of-interest Imaging," Solid-State Circuits Conference Digest of Technical Papers (ISSCC), Feb. 17, 2013 (Feb. 17, 2013), pp. 478-479.
International Search Report and Written Opinion—PCT/US2015/052067—ISA/EPO—dated Jan. 18, 2016.
Lahdenoja, O., et al., "Extracting Local Binary Patterns with MIPA4k Vision Processor," 12th International Workshop on Cellular Nanoscale Networks and their Applications (CNNA), Feb. 3, 2010, 5 pages.
Suarez M., et al., "CMOS-3D Smart Imager Architectures for Feature Detection", IEEE Journal on Emerging and Selected Topics in Circuits and Systems, IEEE, Piscataway, NJ, USA, vol. 2, No. 4, Dec. 1, 2012 (Dec. 1, 2012), pp. 723-736, XP011479510, ISSN: 2156-3357, DOI: 10.1109/JETCAS.2012.2223552.
Delbruck, T., et al., "Activity-Driven, Event-Based Vision Sensors," Proceedings of 2010 IEEE International Symposium on Circuits and Systems (ISCAS), 2010, 4 pages.
Etienne-Cummings, R., et al., "A Programmable Focal-Plane MIMD Image Processor Chip", IEEE Journal of Solid-State Circuits, Jan. 2001, vol. 36, No. 1, pp. 64-73.
Hsiao, P.Y., et al., "A Novel CMOS Imager with 2-Dimensional Binarization and Edge Detection for Highly Integrated Imaging Systems," Digest of Technical Papers. International Conference on Consumer Electronics, 2006, pp. 71-72.
Lahdenoja, O., et al., "A Massively Parallel Algorithm for Local Binary Pattern based Face Recognition", IEEE, ISCAS 2006, pp. 3730-3733.
Laiho, M., et al., "Dedicated Hardware for Parallel Extraction of Local Binary Pattern Feature Vectors", 2005 9th International Workshop on Cellular Neural Networks and Their Applications, IEEE, May 2005, pp. 27-30.
Pierzchala, E., et al., "High Speed Field Programmable Analog Array Architecture Design", Analogix Corporation, Feb. 1994, 61 pages.
Poikonen, J., et al., "MIPA4k: A 64×64 Cell Mixed-mode Image Processor Array", ISCAS 2009, IEEE, May 24, 2009, pp. 1927-1930.
Posch, C., et al., "An Asynchronous Time-Based Image Sensor," IEEE International Symposium on Circuits and Systems (ISCAS), 2008, 4 pages.
Qualcomm, "FAST Corners", Sep. 15, 2015, 6 Slides (153289 IDF).
Shi, Y., et al., "Smart Cameras: Fundamentals and Classification," Chapter 2, A.N. Belbachir (Ed.), Springer Science+Business Media, LLC 2010, pp. 19-34.
Stack Overflow, "FAST Detector in every levels on Gaussian Pyramids", matlab, Retrieved from internet, URL:http://stackoverflow.com/questions/24222611/fast-detector-in-every-levels-on-gaussian-pyramids, on Sep. 11, 2015, 2 Pages.

(56) References Cited

OTHER PUBLICATIONS

Wikipedia, "Features from accelerated segment test", Retrieved from Internet, URL: https://en.wikipedia.org/wiki/Features_from_accelerated_segment_test#High-speed_test , on Sep. 11, 2015, 6 Pages.

Wyatt, J.L., et al., "The MIT Vision Chip Project: Analog VLSI Systems for Fast Image Acquisition and Early Vision Processing," IEEE International Conference on Robotics and Automation, 1991, vol. 2, pp. 1330-1335.

Yu, H, "FAST Corner detection—Machine Learning for high speed corner detection", Nov. 16, 2010, 60 Slides.

"Hooking up Pixy to a Microcontroller Like an Arduino", Aug. 28, 2014 (Aug. 28, 2014), pp. 1-3, Retrieved from the Internet: URL: https://web.archive.org/web/20140828021832/http://cmucam.org:80/projects/cmucam5/wiki/Hooking_up_Pix . . . [retrieved on Nov. 19, 2018].

Pixy: "Pixy Kickstarter Video", Youtube, Apr. 2, 2014 (Apr. 2, 2014), 3 Pages, XP054978882, Retrieved from the Internet: URL: https://www.youtube.com/watch?time_continue=20&v=J8sI3nMIYxM [retrieved on Nov. 20, 2018].

"Teach Pixy an Object", Aug. 21, 2014 (Aug. 21, 2014), pp. 1-3, Retrieved from the Internet: URL: https://web.archive.org/web/20140821021250/http://www.cmucam.org:80/projects/cmucam5/wiki/teach_Pixy . . . [retrieved on Nov. 19, 2018].

\* cited by examiner

EVENT BASED COMPUTER VISION COMPUTATION

CROSS REFERENCE SECTION

This application is a non-provisional application and claims the benefit and priority of U.S. Provisional Application No. 62/057,927, filed on Sep. 30, 2014, titled "EVENT BASED COMPUTER VISION COMPUTATION," which is herein incorporated by reference in its entirety for all purposes.

BACKGROUND

The present disclosure generally relates to enabling computer vision, and more specifically, improving efficiency for detecting features using computer vision.

Computer vision is a field that includes methods for acquiring, processing, analyzing, and understanding images for use in applications. Traditionally, a processor coupled to a sensor, acquires image data from a sensor and performs certain computer vision (CV) operations on the information received from the sensor for detecting CV features and consequently objects associated with those features. Features may include edges, corners, etc. These CV features may be used in determining macro-features, such as faces, smiles and gestures. Programs executing on the processor may utilize the detected features in a variety of applications, such as plane-detection, face-detection, smile detection, gesture detection, etc.

Much effort has been made in recent years to enable computing devices to detect features and objects in the field of view of the computing device. Computing devices, such as mobile devices, are designed with sensitivity towards the amount of processing resources and power used by the mobile device and heat dissipation. However, traditionally, detecting features and objects in the field of view of the computing device, using a camera, requires significant processing resources resulting in higher power consumption and lower battery life in computing devices, such as mobile devices.

BRIEF DESCRIPTION OF THE DRAWINGS

Aspects of the disclosure are illustrated by way of example. The following description is provided with reference to the drawings, where like reference numerals are used to refer to like elements throughout. While various details of one or more techniques are described herein, other techniques are also possible. In some instances, well-known structures and devices are shown in block diagram form in order to facilitate describing various techniques.

A further understanding of the nature and advantages of examples provided by the disclosure may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, the reference numeral refers to all such similar components.

SUMMARY

Figure 1:
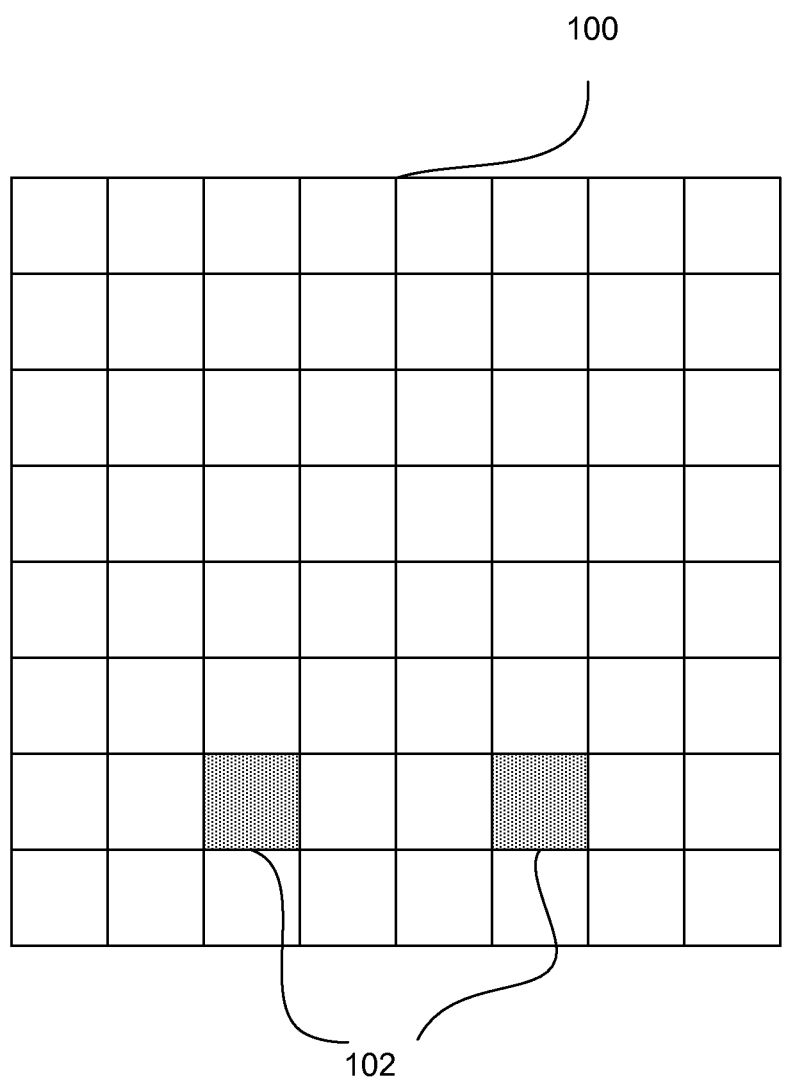
FIG. 1 illustrates an example sensor comprising a plurality of sensor elements arranged in a 2-dimensional array.

The present disclosure generally relates to enabling computer vision, and more specifically, improving efficiency for detecting features using computer vision.

In one aspect, techniques are provided for triggering events based on detecting changes in computer vision (CV) features, such as edges, corners etc., by generating computed results based on sensor readings. In another aspect, techniques also provided for detecting CV features once an event is detecting based on a change in a sensor reading for a sensor element. In certain aspects, the event detection logic and the feature calculation CV operations may be performed, individually, or in combination in circuitry on a sensor or in software/firmware on a computing device.

An example vision sensor may include a sensor element array comprising a plurality of sensor elements, the plurality of sensor elements arranged along at least a first dimension and a second dimension of the sensor element array, each of the plurality of sensor elements capable of generating sensor readings based on light incident upon the sensor elements. Furthermore, the vision sensor may include a dedicated computer vision (CV) computation hardware configured to compute a localized CV feature for a subject sensor element based on at least sensor readings for the subject sensor element and neighboring sensor elements for the subject sensor element, and generate an event based on a change in the computed CV feature from a previously computed CV feature for the subject sensor element, the event including information relating to a location of the subject sensor element associated with the change in the computed CV feature.

In certain aspects of the disclosure, the dedicated CV computation hardware may be implemented as a dedicated CV processing module, in-pixel circuitry or peripheral circuitry. A pixel may include a sensor element and the in-pixel circuitry. The event generated at the dedicated CV computation hardware in some instances may be sent to an application processor. Computing the localized CV feature may include generating a local binary pattern (LBP) label, a variation of the LBP label or a histogram of signed gradient (HSG) label. In some instances, the sensor elements of the sensor element array may include at least one photodiode. In some aspects of the disclosure, the event may be generated using dynamic vision sensor (DVS) circuitry.

Aspects of the disclosure further disclose methods, and apparatus comprising means for performing aspects disclosed above and throughout the disclosure. Aspects of the disclosure, further disclose a non-transitory computer-readable storage medium, wherein the non-transitory computer-readable storage medium may include instructions executable by a dedicated computer vision microprocessor for performing aspects of the disclosure discussed above and throughout the specification.

The foregoing has outlined rather broadly features and technical advantages of examples in order that the detailed description that follows can be better understood. Additional features and advantages will be described hereinafter. The conception and specific examples disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages, will be better understood from the following description when considered in connection with the accompanying figures. Each of the figures is provided for the purpose of illustration and description only and not as a definition of the limits of the claims.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

A sensor may include a sensor element array of a plurality of sensor elements. The sensor element array may be a 2-dimensional array that includes sensor elements arranged in two dimensions, such as columns and rows, of the sensor element array. Each of the sensor elements may be capable of generating a sensor reading based on environmental conditions. In certain implementations, the sensor may be a vision sensor and may generate sensor readings based on light incident upon the sensor elements. FIG. 1 illustrates an example sensor 100 comprising a plurality of sensor elements arranged in a 2-dimensional array. In FIG. 1, the illustration of the sensor 100 represents 64 (8×8) sensor elements in the sensor element array. In various implementations, the shape of the sensor elements, the number of sensor elements and the spacing between the sensor elements may vastly vary, without departing from the scope of the invention. Sensor elements 102 represents example sensor elements from a grid of 64 sensor elements.

Figure 2:
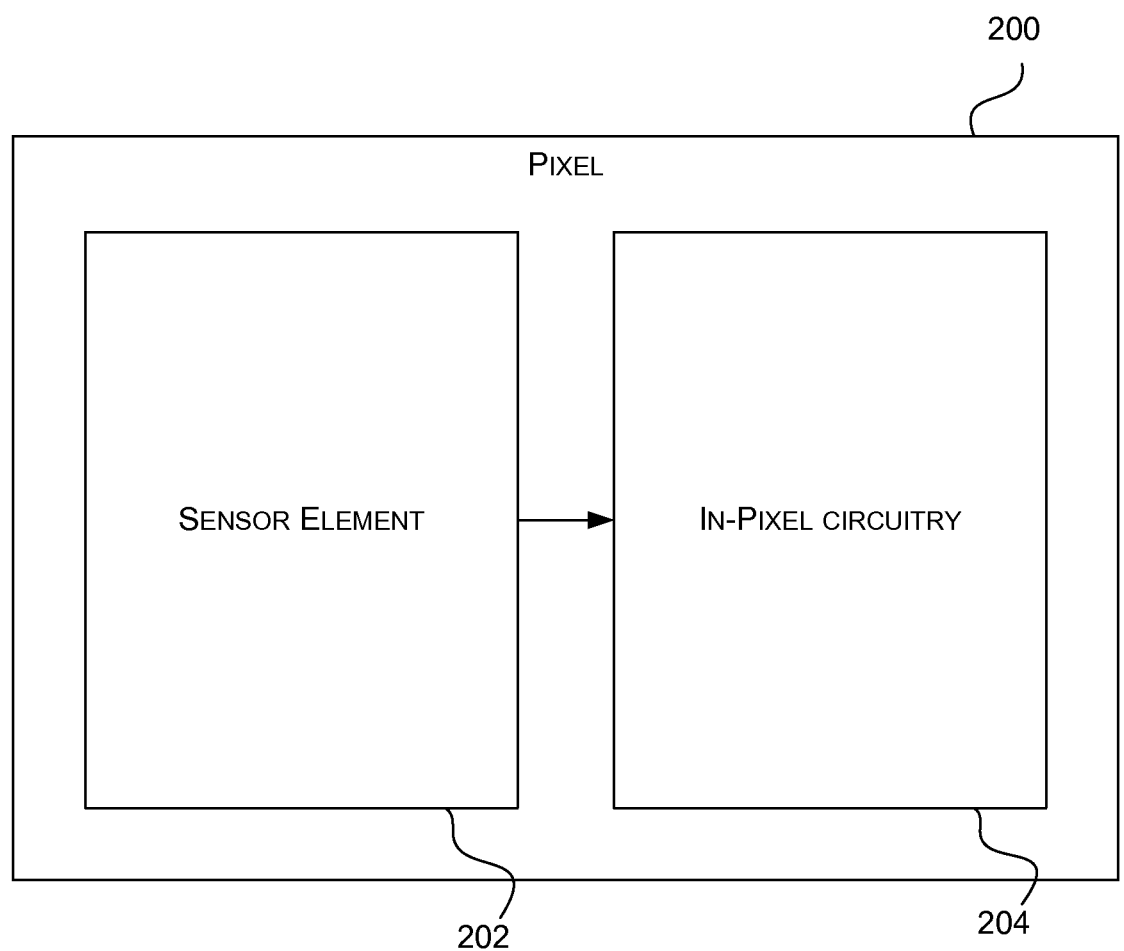
FIG. 2 illustrates an example pixel comprising a sensor element and in-pixel circuitry.

In certain implementations, the sensor elements may have dedicated computer vision (CV) computation hardware implemented as in-pixel circuitry (computation structure) coupled to the sensor element. In some implementations, the sensor element and the in-pixel circuitry together may be referred to as a pixel. The processing performed by the in-pixel circuitry coupled to the sensor element may be referred to as in-pixel processing. In some instances, the sensor element array may be referred to as the pixel array, the difference being that the pixel array includes both the sensor elements and the in-pixel circuitry associated with each sensor element. FIG. 2 illustrates an example pixel 200 with a sensor element 202 and in-pixel circuitry 204. In certain implementations, the in-pixel circuitry 204 may be analog circuitry, digital circuitry or any combination thereof.

Figure 3:
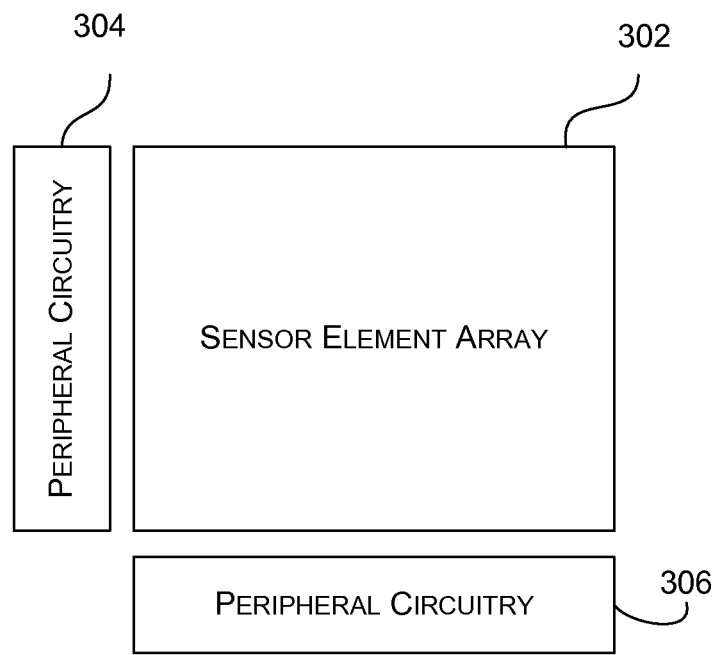
FIG. 3 illustrates an example sensor element array coupled to peripheral circuitry.

In certain implementations, the sensor element array may have dedicated CV computation hardware implemented as peripheral circuitry (computation structure) coupled to a group of sensor elements. Such peripheral circuitry may be referred to as on-chip sensor circuitry. FIG. 3 illustrates an example peripheral circuitry (304 and 306) coupled to the sensor element array 302.

Figure 4:
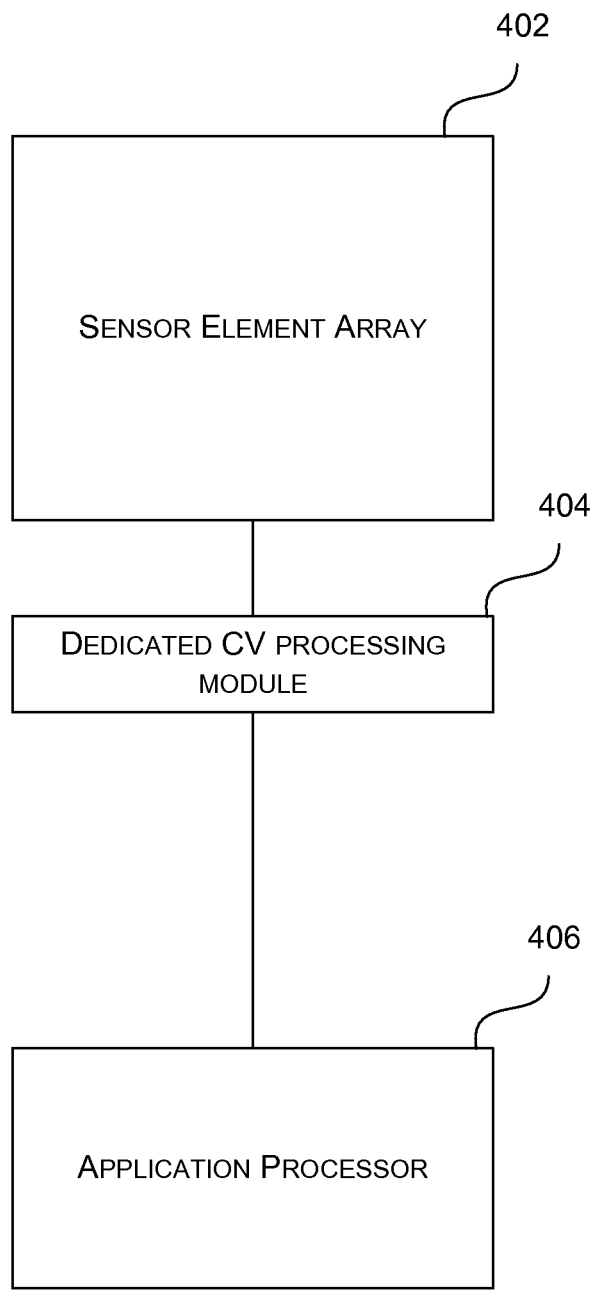
FIG. 4 illustrates an example sensor element array coupled to a dedicated computer vision (CV) processing module.

Furthermore, as shown in FIG. 4, in certain implementations, the sensor element array may have dedicated CV computation hardware implemented as dedicated CV processing module 404 coupled to the sensor element array 402 and implemented using an Application Specific Integrated Circuit (ASIC), Field Programmable Gate Array (FPGA), embedded microprocessor, or any similar analog or digital computing logic for performing aspects of the disclosure. In certain implementations, the dedicated CV computation hardware implemented as dedicated CV processing module 404 may be configured to execute instructions stored on a non-transient computer medium device for calculating CV features.

It should be noted, that at least in certain implementations, the dedicated CV processing module 404 is in addition to an application processor 406 and not instead of the application processor 406. For example, the dedicated CV processing module 404 may process and/or detect CV features. Whereas the application processor 406 may receive indications of these detected CV features and pattern match against previously stored images or reference indicators to determine macro-features, such as smiles, faces, objects, etc. In addition, the application processor 406 may be relatively vastly more complex, compute intensive, power intensive and responsible for executing system level operations, such as operating system, implementing the user interface for interacting with the user, performing power management for the device, managing memory and other resources, etc. The application processor 406 may be similar to processor(s) 1910 of FIG. 19.

Figure 5:
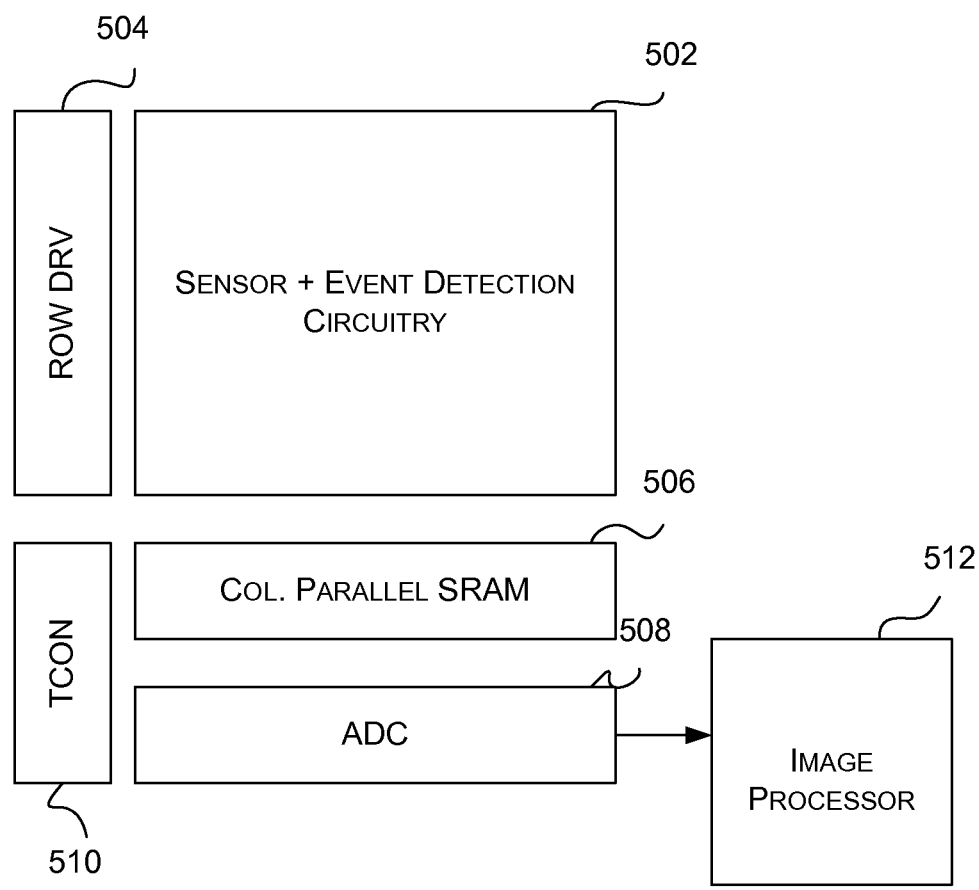
FIG. 5 illustrates an example implementation of a vision sensor using an event-based camera.

FIG. 5 illustrates example implementations for sensing apparatus comprising vision sensors. Several techniques may be employed for acquiring an image or a sequence of images, such as a video, using one or more cameras coupled to a computing device.

FIG. 5 illustrates an example implementation of a vision sensor using an event-based camera. A vision sensor may be used in an image or video camera for acquiring image data. Event based camera sensors may be configured to acquire image information based on an event. In one implementation, the event-based camera may comprise a plurality of pixels, as shown in FIG. 1. Each pixel may comprise a sensor element and in-pixel circuitry. Each pixel may be configured to acquire image data based on an event detected at the pixel. For example, in one implementation, a change in the environmental conditions (e.g., change in light reflecting off an object) perceived at any given pixel may result in a voltage change beyond a threshold and may result in an event at the pixel. In response to the event, the logic associated with the pixel may send the sensor reading to the processor for further processing.

Figure 6:
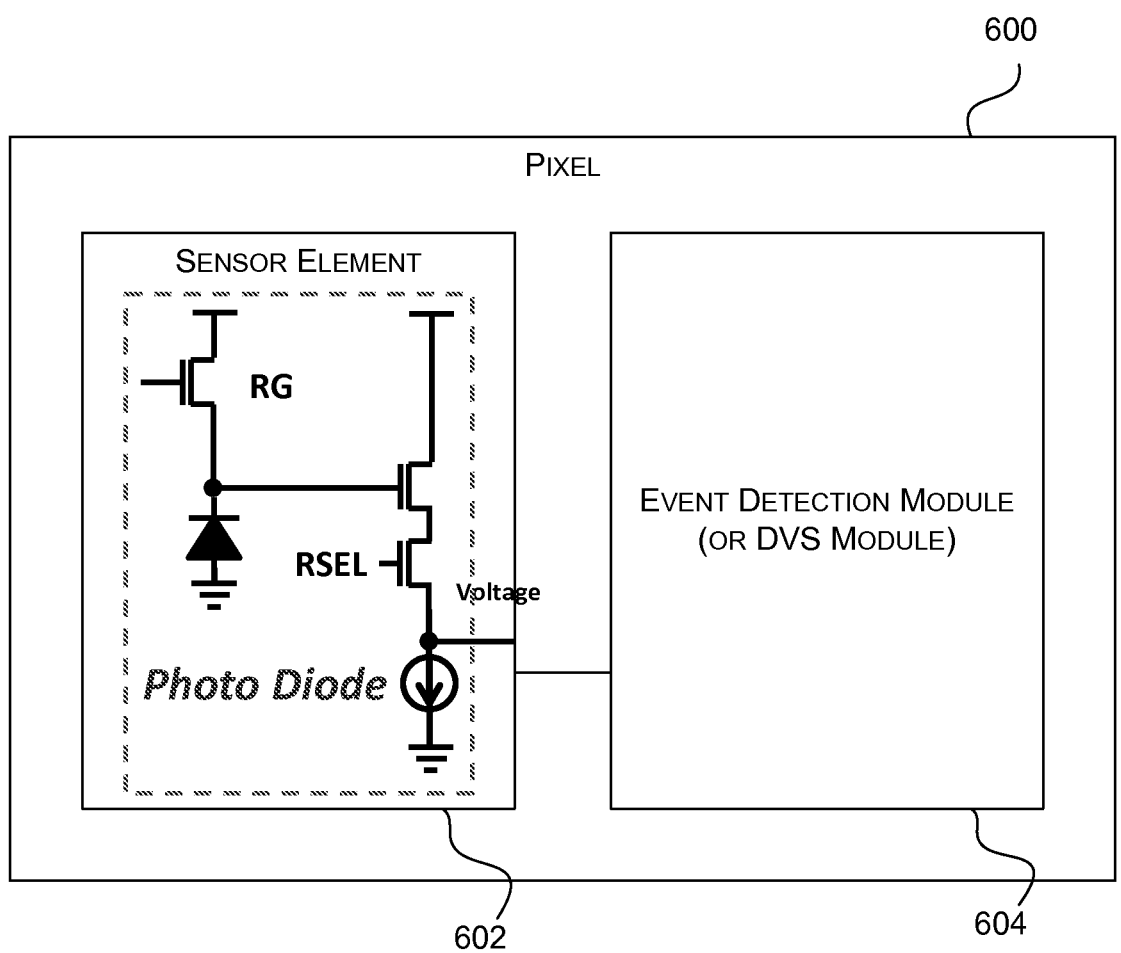
FIG. 6 illustrates an example pixel for a vision sensor.

Referring to FIG. 6, each pixel may include a photo diode 602 and dynamic vision sensors (DVS) 604 circuitry. DVS module may also be referred to as Event detection module. Event detection module detects a change in the value at a pixel and generates an event indicator. Sensor reading is sent out to a processor when the intensity of the pixel changes beyond a threshold, indicating an event. In some instances, the location of the sensor element at which the event was detected along with a payload is sent to a computer system for further processing. In one implementation, the payload may be the voltage intensity, the change in the voltage intensity or the polarity (sign) of the change in the voltage intensity. In some instances, event based cameras may result in a substantially lower amount of data being transferred to a processor for further processing, as compared to traditional frame based cameras, resulting in power savings.

Referring back to FIG. 5, block 502 collectively represents the sensor and the event detection circuitry. Block 502 represents a sensor with a plurality of pixels, each pixel comprising a sensor element and circuitry for event detection. Each pixel generates a sensor reading using the sensor element. The sensor readings are later digitized i.e., converted from analog to digital data using an ADC converter 508. In one embodiment, the result of a previous sensor readings may be stored in the Column parallel SRAM 506 for each pixel. In some instances, the results stored in the Column parallel SRAM 506 may be used by the comparator to compare and trigger an event, based on a comparison between the current sensor reading and a previous sensor reading. The analog information acquired at the pixel is converted to the digital domain using an analog to digital (ADC) converter 508. The digitized sensor reading may be sent to the processor 512 for further image processing for calculating CV features.

The image processor 512 may calculate certain CV features on the information received from the individual pixels for detecting features and consequently objects associated with those features. Features may include less complex features such as edges, corners, etc. Calculation of CV features may use information from multiple pixels from the sensor element array for detecting features by performing a multi-pixel computation. For example, for calculating CV features for a subject sensor element or pixel, the CV operations may use sensor readings generated by neighboring sensor elements or pixels in proximity to the subject sensor element or pixel.

In certain embodiments, calculating lower level CV features such as linear binary pattern (LBP), variations of LBP and histogram of signed gradient (HSG) labels, on an application processor 406, such as the image processor 512 may be power and processing intensive. In many instances, an event detected at the pixel level may be spurious leading to a chain of events up until the change is discarded by performing CV operations on the pixel value at the application processor 406. Furthermore, converting the analog pixel value to digital pixel value may consume power. Moreover, detecting CV features on the application processor 406 may be power and processing intensive, since performing CV operations on the application processor 406 in many instances requires storing of information from the sensors in system memory, triggering processing of the sensor information, fetching of instructions from memory for CV computations, and storing the results. In addition, application processors 406 are generally power hungry when executing instructions. A spurious or uninteresting event from the sensor wakes up the application processor 406 that might be operating in a low-power mode due to inactivity and drastically increase the power consumption for the system.

Certain embodiments of the invention describe techniques for performing event based CV operations, such as LBP, variations of LBP and HSG label computations using dedicated CV computation hardware, instead of waking up the application processor 406 and computing these low level CV features at the application processor 406.

By performing the CV operations for detecting CV features by a dedicated CV computation hardware, either inside the pixel or in close proximity to the pixel, in some instances, events can be detected at a feature level granularity rather than a pixel level granularity. Detecting events at a feature level granularity may reduce the number of false positive events generated and sent to the application processor 406 for further processing.

As described herein, the dedicated CV computation hardware computes CV features or localized CV features for each of the subject sensor elements based on, at least in part, on signals associated with a plurality of neighboring sensor elements in proximity to the subject sensor element.

As described herein, the sensor elements relatively close to the subject sensor element may be referred to as neighboring sensor elements. In certain aspects of the disclosure, the neighboring sensor elements may include sensor elements immediately adjacent to the subject sensor element. In certain other aspects of the disclosure, neighboring sensor elements may also include sensor elements that are relatively close to the subject sensor element and not immediately adjacent. For example, in certain instances, sensor elements within three sensor elements from the subject sensor element may still be considered neighboring sensor elements when the width or height of the number of sensors is sixty four sensor elements.

As described herein, CV features or localized CV features may refer to detecting low level CV markers or indicators, such as labels associated with each sensor element or pixel of the sensor. For example, a label may include an LBP label for a sensor element. An LBP label for a sensor element may be generated by comparing the sensor readings of the sensor element and some of its neighboring sensor elements. An LBP label may indicate if the CV feature from the reference of the sensor element represents an edge, corner, curve, spot, etc. Other techniques such as HSG or other suitable variants of LBP may be used for detecting CV features without deviating from the scope of the disclosure.

As described herein, detecting and/or generating an event based on a change in the CV feature may refer to detecting a change of a feature from the perspective of a sensor element or a small group of sensor elements. For example, an event may be detected and/or generated if the LBP label at a sensor element changes. In other words, if the CV feature detected at the sensor element changes from a spot to an edge, this may trigger generation of an event.

Besides LBP labels discussed herein, different types of CV features may also include variations of the computing LBP label. Such variations may include (CS)-LBP, where the central pixel/block is not considered and all opposing corners/edges around the central block are compared and 4 comparison labels are generated as a result, which then represents the LBP label, and is used in the same way as previously described LBP. Other variations include, but are not limited to "patch-symmetric" LBP (where center pixel/block is not considered in the comparison but an average of the entire 3×3 patch is computed, and then each edge/corner is compared to the average) and "local tertiary pattern (LTP)," (a variation of LBP that can include results +1, 0, and −1—not just 1 or zero; zero meaning difference is below a threshold, and +1 and −1 meaning difference is greater than a threshold but also takes into account whether the sign of the difference).

As described in more detail below, the generation of an event with additional information, such as location and CV feature information may be provided to an application processor for further processing. In one aspect of the disclosure, the application processor may use these events and the associated information for detecting macro-features, such as smiles, faces, or any other object for that matter.

Figure 7:
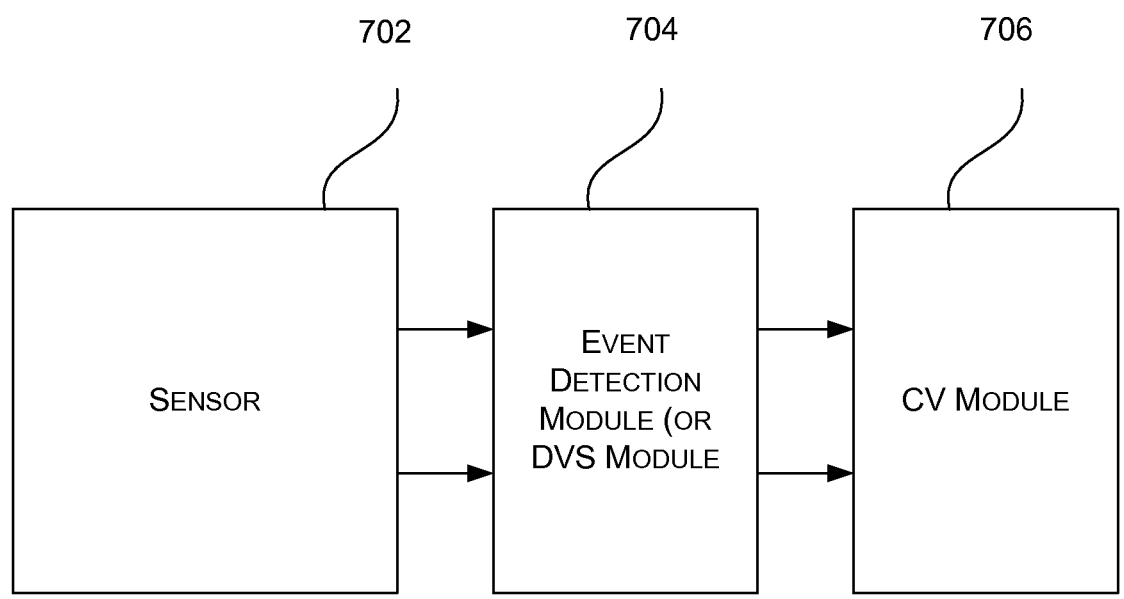
FIG. 7 illustrates an example block diagram for a sensing apparatus for calculating CV features.

FIG. 7 illustrates an example block diagram for a sensing apparatus for calculating and detecting CV features based on detected events. FIG. 7 illustrates a sensor 702, Event detection module 704 and CV module 706. As shown in FIG. 7, after generating a sensor reading from the sensor 702, the Event detection module 704 may detect an event based on the change detected in the sensor reading. Once an event signifying a change in a pixel value is detected the CV module may calculate CV features and detect an event on a feature level granularity. In some instances, upon detection of a feature, applications executing on the processor may use the detected features.

The sensor 702, Event detection module 704 and CV module 706 may be implemented in various different configurations at various different granularities. For example, the sensor in FIG. 7 may represent a single sensor element, such as sensor element 102 in FIG. 1, or the entire sensor element array, such as sensor 100 in FIG. 1. In certain embodiments, the Event detection module 704 or/and the CV module 706 may be implemented in analog or digital in the in-pixel circuitry 204, peripheral circuitry 304/306 or dedicated CV processing module 404.

The Event detection module 704 may be implemented as in-pixel circuitry or peripheral circuitry or any combination thereof. In configurations where the Event detection module 704 processes sensor readings for a plurality of pixels, the Event detection module 704 may process sensor readings from sensor elements associated with one dimension of the sensor element array, such as a column (also referred to as column parallel DVS) or the entire sensor element array.

The CV module 706 may be implemented as in-pixel circuitry inside each of the sensor pixels 204, as peripheral circuitry 304 or as a dedicated CV processing module 404 for processing sensor readings for a plurality of pixels, as on-chip or off-chip sensor circuitry or any combination thereof. In configurations where the CV module 706 processes sensor readings for a plurality of pixels, the CV module 706 may process sensor readings from sensor elements associated with one dimension of the sensor element array, such as a column (also referred to as column parallel CV) or the entire sensor element array. In some implementations, the CV module 706 may be implemented in firmware/software instructions for executing on the dedicated CV processing module 404 in the digital domain.

Although not shown, the CV module 706 may be configured to perform analog or digital operations representative of a multi-pixel computation for a sensor element, based on sensor readings generated by neighboring sensor elements in proximity to the referenced sensor element.

Figure 8:
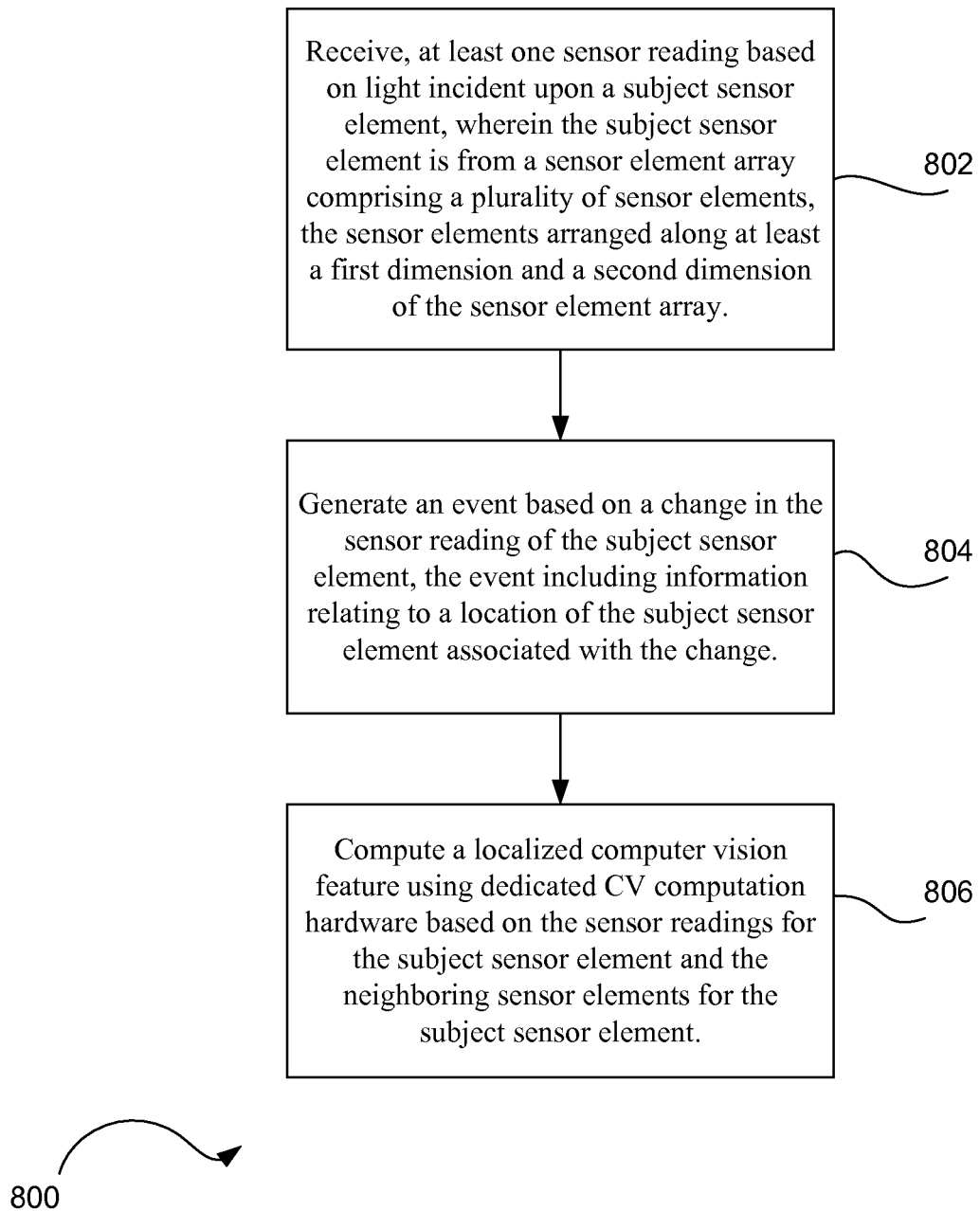
FIG. 8 is an example flowchart, according to certain aspects of the disclosure.

FIG. 8 is an example flowchart, according to certain aspects of the disclosure. Some or all of the process 800 (or any other processes described herein, or variations and/or combinations thereof) may be performed by circuitry or logic. The circuitry or logic may be implemented in the in-pixel circuitry, peripheral circuitry or dedicated CV processing module, or any combinations thereof. In some instances all or portions of the logic may be implemented using instructions, executed on the digital circuitry and stored on a non-transitory computer readable medium.

At block 802, components of sensor array element, such as a subject sensor element, receives at least one sensor reading based on light incident upon the subject sensor element. The sensor element array comprises a plurality of sensor elements. The sensor elements may be arranged along at least a first dimension and a second dimension of the sensor element array. In certain aspects of the disclosure, the sensor element array is a vision sensor, and each of the sensor elements includes a photo diode.

At block 804, components disclosed herein, such as a dedicated CV computation hardware, detects a change in the sensor reading for the subject sensor element and generates an event. In certain implementations, event detection circuitry or DVS module is used in detecting and generating the event.

At block 806, components disclosed herein, such as the dedicated CV computation hardware, computes a localized CV feature based on the sensor readings for the subject sensor element and the neighboring sensor elements for the subject sensor element.

As described herein, CV features or localized CV features may refer to low level CV markers or indicators, such as labels associated with each sensor element or pixel of the sensor. For example, a label may include an LBP label for a sensor element. An LBP label for a sensor element may be generated by comparing the sensor readings of the sensor element and some of its neighboring sensor elements. An LBP label may indicate if the CV feature from the reference of the sensor element represents an edge, corner, curve, spot, etc. Other techniques such as HSG or other suitable variants of LBP may be used for detecting CV features without deviating from the scope of the disclosure. The localized CV features may be inferred from a LBP label or a HSG label.

In certain aspects of the disclosure, the dedicated CV computation hardware is implemented as part of a dedicated CV microprocessor, such as the dedicated CV processing module 404 in FIG. 4. In certain other aspects of the disclosure, the dedicated CV computation hardware may be implemented as in-pixel circuitry 204 or peripheral circuitry 304. In certain aspects of the disclosure, the computed CV feature is sent to an application processor 406 from the dedicated CV computation hardware for further processing.

It should be appreciated that the specific steps illustrated in FIG. 8 provide a particular method of switching between modes of operation, according to one embodiment. Other sequences of steps may also be performed in alternate embodiments. For example, alternative embodiments may perform the steps/blocks outlined above in a different order.

To illustrate, a user may choose to change from the third mode of operation to the first mode of operation, the fourth mode to the second mode, or any combination therebetween. Moreover, the individual steps/blocks illustrated in FIG. 8 may include multiple sub-steps that may be performed in various sequences as appropriate to the individual step. Furthermore, additional steps/blocks may be added or removed depending on the particular applications. One of ordinary skill in the art would recognize and appreciate many variations, modifications and alternatives of the process.

FIG. 9, FIG. 10, FIG. 11 and FIG. 12 are example configurations for performing DVS operations prior to performing CV operations, as described with respect to FIG. 7 and FIG. 8.

Figure 9:
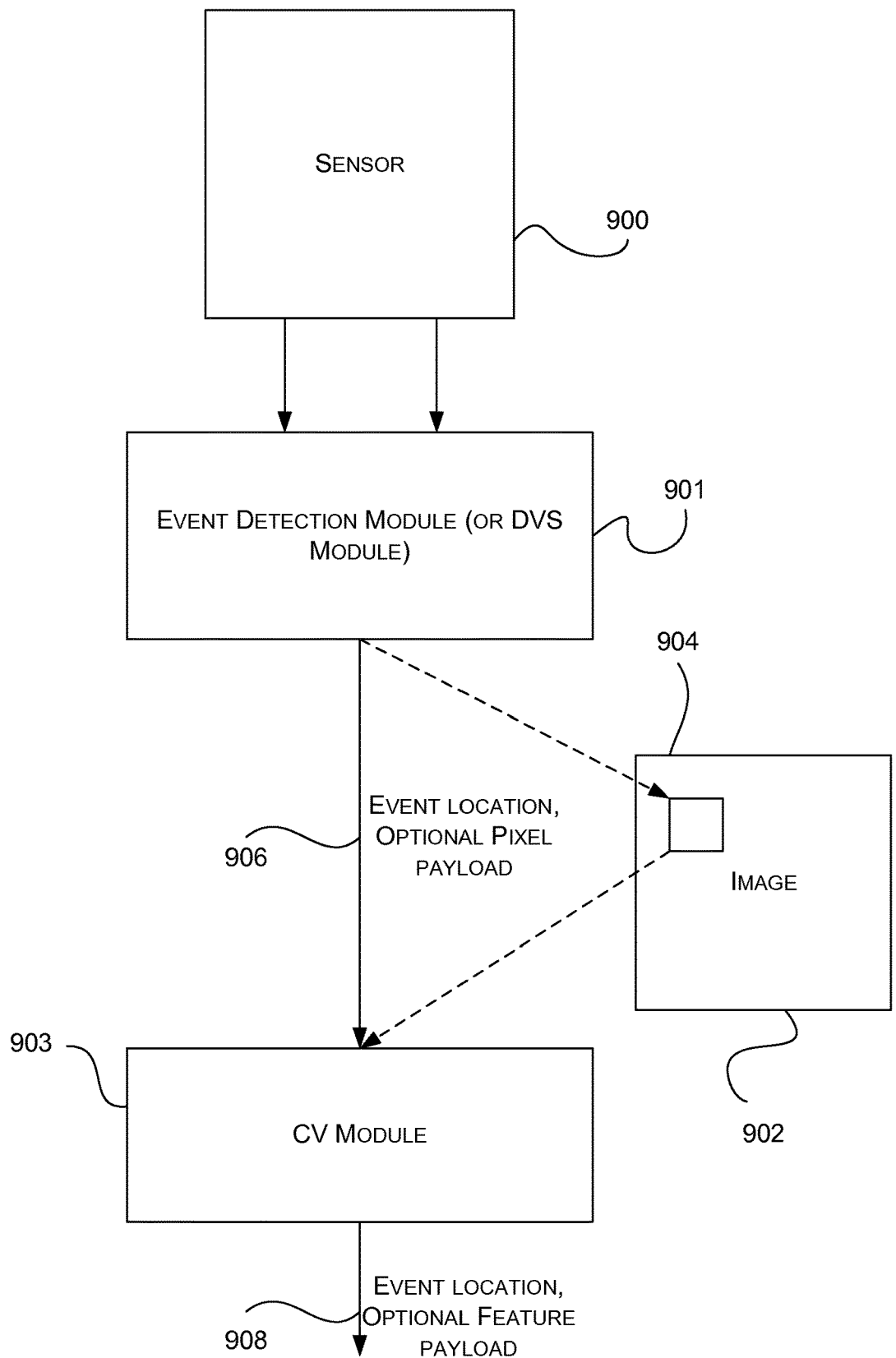
FIG. 9 illustrates example information transmitted between the Event detection module and the CV module in FIG. 7.

FIG. 9 illustrates example information transmitted between the Event detection module 704 and the CV module 706 in FIG. 7. In one implementation, the DVS module 901 detects an event associated with a location of a sensor element at the sensor element array 900. The DVS module 901 may raise an event to the CV module 903 along with information 906 that comprises the location of the sensor element at the sensor element array and an optional payload. The payload may include the voltage intensity, the change in the voltage intensity or the polarity of the change.

The location of the event or the sensor element associated with the event may correspond to an image pixel for an image 904. The CV module 903 may access a group of image pixel values 902 that include the neighboring values of the image pixel for which an event was detected, so that a CV feature can be detected for that group of pixels, instead of recalculating the CV feature set for the entire image 904. In one implementation, where the CV feature is detected in circuitry, the value for the neighboring pixels may be accessed from the previous value maintained in the capacitors of the neighboring pixels. In another implementation, where the CV module 903 operates in a computing system, the neighboring values may be retrieved from memory from the stored image.

The CV module 903 processes the event location and the optional pixel payload and generates an optional feature payload 908. The location and the optional feature payload 908 may be passed to an application processor 406 for further use in an application.

Figure 10:
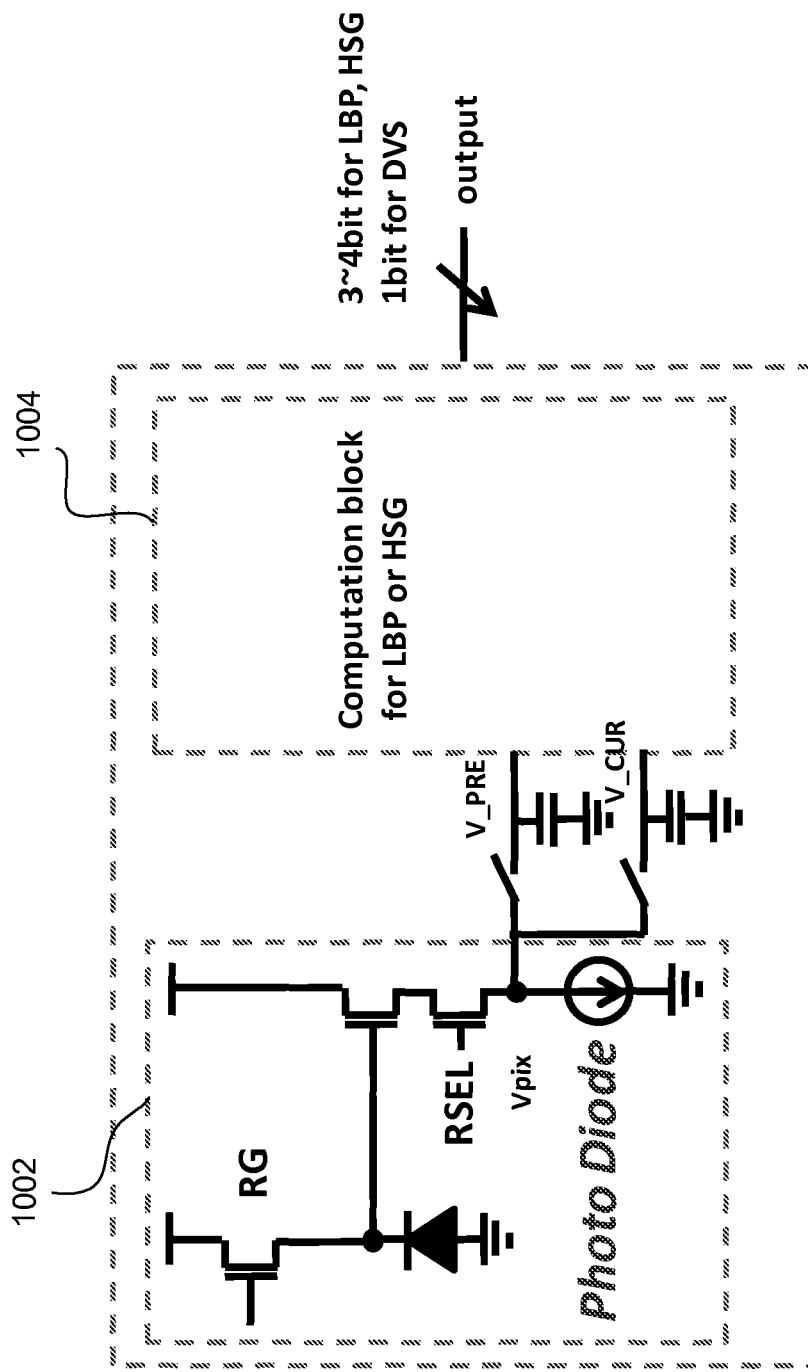
FIG. 10 illustrates an example pixel for performing aspects of the disclosure.

FIG. 10 illustrates an example pixel for performing aspects of the disclosure. The pixel in FIG. 10 comprises sensory circuitry 1002 (i.e., photodiode) and DVS and/or CV circuitry 1004 for in-pixel analog or digital processing. As shown in FIG. 10, in certain implementations, multiple capacitors may be used for storing previous (V_PRE) and current (V_CUR) voltages. The CV block 1004 may calculate LBP labels, variations of LBP labels or HSG labels for CV feature detection. The output may include information indicating aspects of the CV feature detection and information from the Event detection module indicating an event. For example, in one aspect of the disclosure, the output may include 3-4 bits of information regarding the CV (i.e. LBP or HSG) feature detection and another bit for the occurrence of the event itself.

Figure 11:
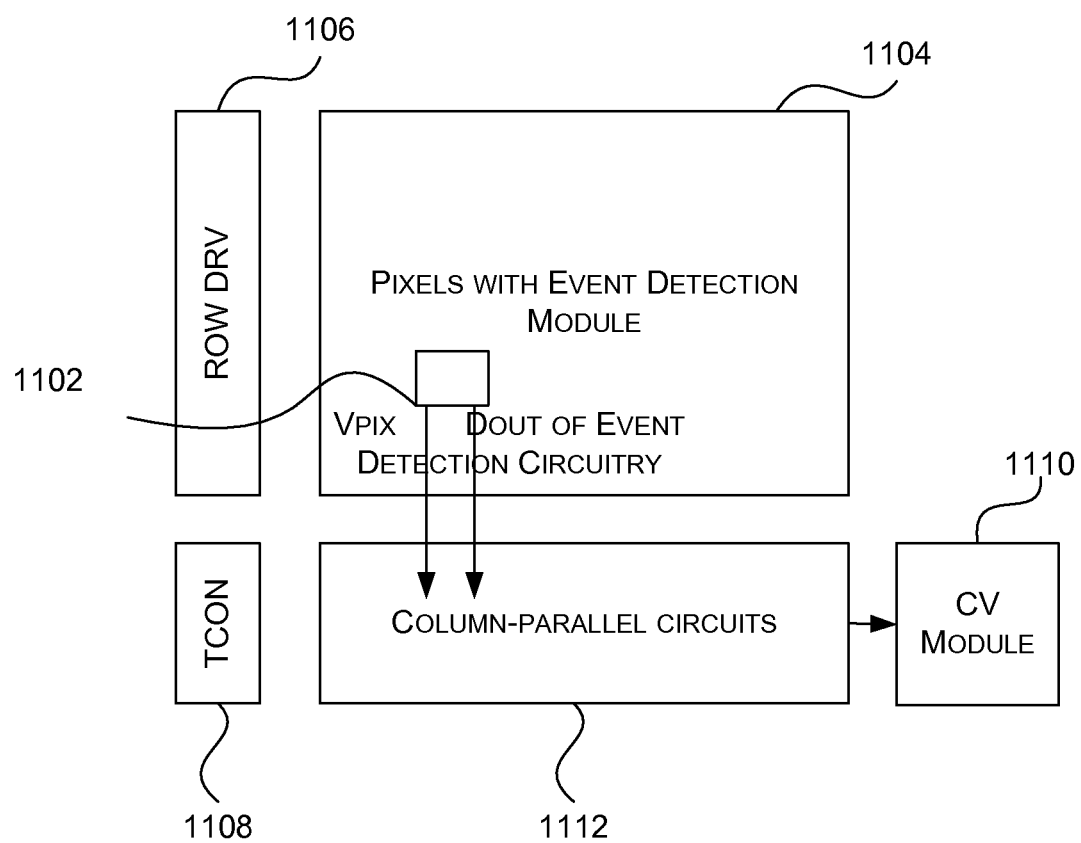
FIG. 11 illustrates an example sensor apparatus for performing aspects of the disclosure.

FIG. 11 illustrates an example sensor apparatus implementing Event detection module 702 for performing aspects of the disclosure. In FIG. 11, each pixel similar to the pixel discussed in FIG. 6 comprises a sensor element 602 and Event detection module 604, collectively shown as block 1104. Block 1106 represents a row driver (ROW DRV) for driving data out of the sensor and block 1108 represents a timing controller (TCON). In one embodiment, the result of a previous sensor read may be stored in the Column parallel SRAM 1112 for each pixel. The results stored in the Column parallel SRAM 1112 may be used by the comparator to compare and trigger an event, based on a comparison between the current sensor reading and a previous sensor reading.

In FIG. 11, each pixel may output a digital output from the Event detection module indicating a pixel level change and a voltage reading from the sensor element. As shown in FIG. 11, in some instances, the CV module 1110 may be implemented for a group of pixels or the entire sensor element array. The CV module 1110 may be implemented as peripheral circuitry 304/306 or dedicated CV processing module 404. Implementing the CV module 1110 for a group of pixels or the entire sensor element array may allow for efficiencies in processing the data. For example, the same CV module may be able to sequentially service different groups of pixels. In one implementation, the digital output generated by the Event detection module (Dout of DVS) located on the pixel 1102 may indicate a change to the CV circuitry and may select/trigger the processing logic to process the voltage output from the pixel (Vpix).

Figure 12:
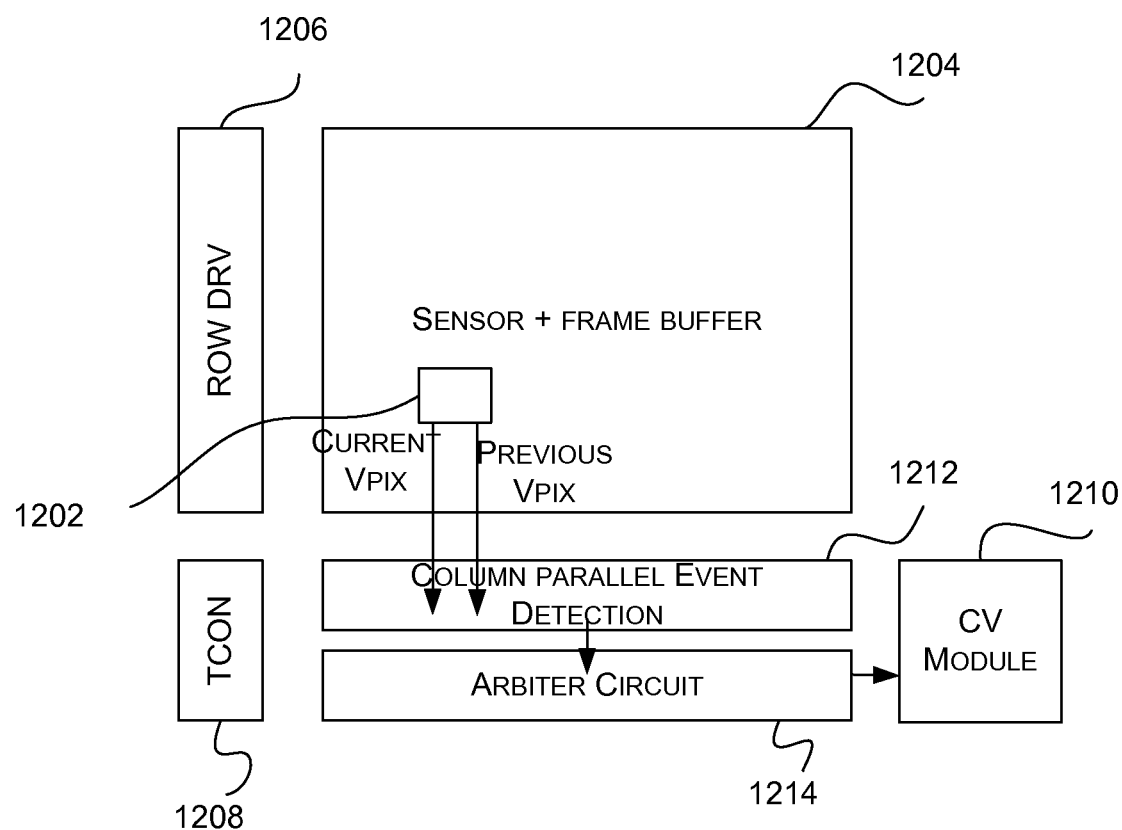
FIG. 12 illustrates another example sensor apparatus for performing aspects of the disclosure

FIG. 12 illustrates another example sensor apparatus for performing aspects of the disclosure and is a variation of the example configuration discussed in FIG. 11. For example, FIG. 12 has components such as the row driver 1206, timing controller 1208 and CV module 1210, similar to FIG. 11. In FIG. 12, each pixel comprises a sensor element. Each pixel, such as pixel 1202, outputs a current voltage (Current Vpix) and a previous voltage (Previous Vpix). The previous voltage may be maintained by the pixel using capacitor circuitry. Event detection module may be implemented as peripheral circuitry 304 or dedicated CV processing module 404, instead for each individual pixel (i.e., in-pixel circuitry 204). As shown in FIG. 12, the Event detection module may be implemented as column parallel Event detection module 1212 for each pixel column. The Event detection module 1212 compares the current voltage and the previous voltage output by the pixel and generates an event, based on the difference between the current voltage output and previous voltage. The arbiter circuitry 1214, shown in FIG. 12, may provide the multiplexing logic for selecting the appropriate columns and driving the appropriate data between the column parallel Event detection module and the CV module 1210.

Figure 13:
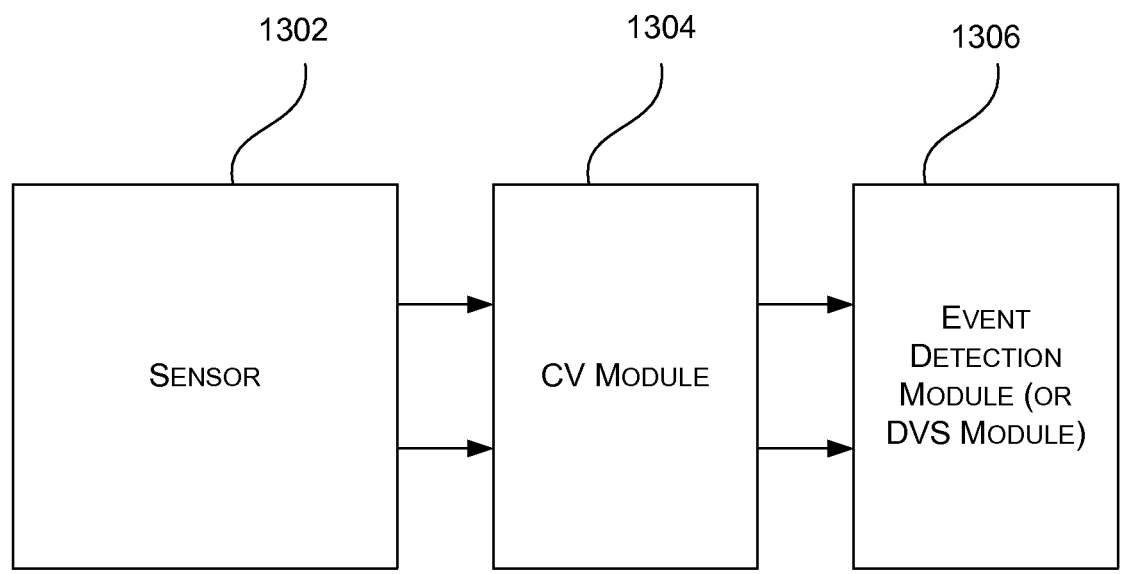
FIG. 13 illustrates another example block diagram for a sensing apparatus performing CV operations.

FIG. 13 illustrates another example block diagram for a sensing apparatus for calculating CV features. FIG. 13 illustrates a sensor 1302, CV module 1304 and DVS module 1306. In contrast to the apparatus described with reference to FIG. 7 (and FIG. 8-12), the CV features in FIG. 13 are calculated prior to the DVS operations. As shown in FIG. 13, after generating a sensor reading from the sensor 1302, the CV module 1304 may process the sensor information and detect a CV feature and pass the information to the DVS module 1306. The DVS module 1306 may consequently detect an event at a CV feature granularity (as opposed to an event at a pixel granularity). In some instances, upon detection of the CV feature, the CV module 1304 may send the information to a processor, such as an application processor 406, for further processing.

The sensor 1302, CV module 1304 and the DVS module 1306 may be implemented in various different configurations at various different granularities. For example, the sensor 1302 in FIG. 13 may represent a single sensor element, such as sensor element 102 from FIG. 1, or the entire sensor element array, such as sensor 100 from FIG. 1.

The CV module 1304 may be implemented as in-pixel circuitry inside each of the sensor pixels, as peripheral circuitry or as dedicated CV processing module for processing sensor readings for a plurality of pixels as on-chip sensor circuitry. In configurations where the CV module 1304 processes sensor readings for a plurality of sensor elements, the CV module 1304 may process sensor readings from sensor elements associated with one dimension of the sensor element array, such as a column (also referred to as column parallel CV) or the entire sensor element array.

Although not shown, the CV module 1304 may be configured to perform analog or digital operations representative of a multi-pixel computation for a pixel, based on sensor readings generated by neighboring sensor elements in proximity to the referenced pixel.

In some implementations, the CV module 1304 may be implemented in firmware/software instructions for executing on a processor in the digital domain.

Similarly, the DVS module 1306 may be implemented as in-pixel circuitry inside each of the sensor pixels, as peripheral circuitry for processing sensor readings for a plurality of pixels as on-chip sensor circuitry or using a dedicated CV processing module. In configurations where the DVS module 1306 processes sensor readings for a plurality of pixels, the DVS module 1306 may process sensor readings from sensor elements associated with one dimension of the sensor element array, such as a column (also referred to as column parallel DVS) or the entire sensor element array.

Figure 14:
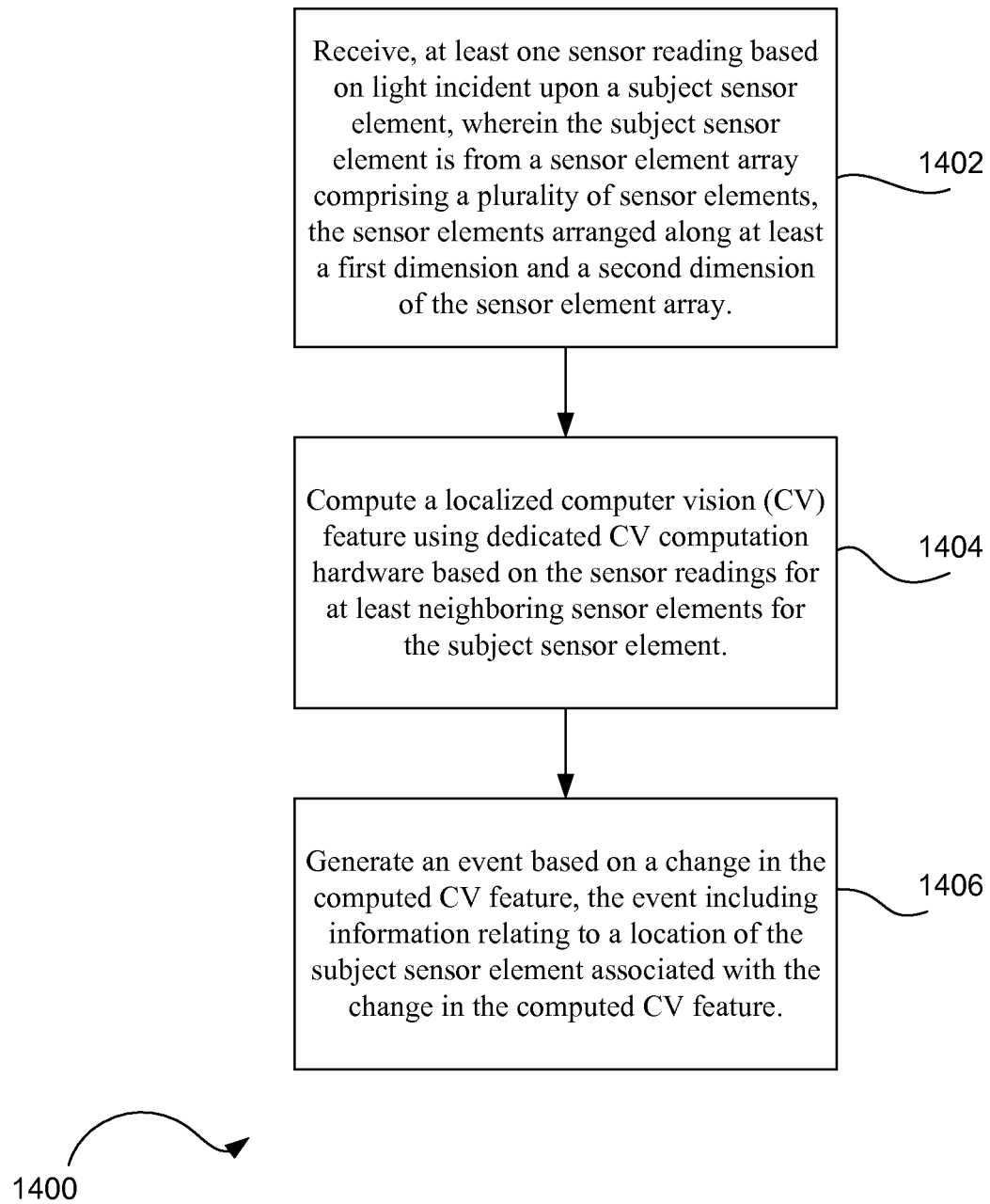
FIG. 14 is an example flowchart, according to certain aspects of the disclosure.

FIG. 14 is an example flowchart, according to certain aspects of the disclosure. Some or all of the process 1400 (or any other processes described herein, or variations and/or combinations thereof) may be performed by circuitry or logic. The circuitry or logic may be implemented in the in-pixel circuitry, peripheral circuitry or dedicated CV processing logic, or any combinations thereof. In some instances all or portions of the logic may be implemented using instructions, executed on the digital circuitry and stored on a non-transitory computer readable medium.

At block 1402, components of sensor array element, such as a subject sensor element, receives at least one sensor reading based on light incident upon the subject sensor element. The sensor element array comprises a plurality of sensor elements, the sensor elements arranged along at least a first dimension and a second dimension of the sensor element array. In certain aspects of the disclosure, the sensor element array is a vision sensor, and each of the sensor elements includes at least one photo diode.

At block 1404, components disclosed herein, such as a dedicated CV computation hardware, computes a localized CV feature, wherein the localized CV feature is based on the sensor readings for at least neighboring sensor elements for the subject sensor element.

As described herein, CV features or localized CV features may refer to low level CV markers or indicators, such as labels associated with each sensor element or pixel of the sensor. For example, a label may include an LBP label for a sensor element. An LBP label for a sensor element may be generated by comparing the sensor readings of the sensor element and some of its neighboring sensor elements. An LBP label may indicate if the CV feature from the reference of the sensor element represents an edge, corner, curve, spot, etc. Other techniques such as HSG or other suitable variants of LBP may be used for detecting CV features without deviating from the scope of the disclosure. The localized CV features may be based on a LBP label or a HSG label.

As described herein, the sensor elements relatively close to the subject sensor element may be referred to as neighboring sensor elements. In certain aspects of the disclosure, the neighboring sensor elements may include sensor elements immediately adjacent to the subject sensor element. In certain other aspects of the disclosure, neighboring sensor elements may also include sensor elements that are relatively close to the subject sensor element and not immediately adjacent. For example, in certain instances, sensor elements within three sensor elements from the subject sensor element may still be considered neighboring sensor elements when the width or height of the number of sensors is sixty four sensor elements.

In certain aspects of the disclosure, the dedicated CV computation hardware is implemented as part of a dedicated CV microprocessor, such as the dedicated CV processing module 404 in FIG. 4. In certain other aspects of the disclosure, the dedicated CV computation hardware may be implemented as in-pixel circuitry 204 or peripheral circuitry 304.

At block 1406, components disclosed herein, such as the dedicated CV computation hardware, generates an event based on a change the computed CV feature, the event including information relating to a location of the subject sensor element associated with the change in the computed CV feature. In certain aspects of the disclosure, the computed CV feature is sent to an application microprocessor from the dedicated CV computation hardware.

As described herein, generating an event based on a change in the CV feature may refer to detecting a change of a feature from the perspective of a sensor element or a small group of sensor elements. For example, an event may be detected and/or generated if the LBP label at a sensor element changes. In other words, if the CV feature detected at the sensor element changes from a spot to an edge, this may trigger generation of an event.

The generated event with additional information, such as location and CV feature information may be provided to an application processor for further processing. In one aspect of the disclosure, the application processor may use these events and the associated information for detecting macro-features, such as smiles, faces, or any other object for that matter.

It should be appreciated that the specific steps illustrated in FIG. 14 provide a particular method of switching between modes of operation, according to one embodiment. Other sequences of steps may also be performed in alternate embodiments. For example, alternative embodiments may perform the steps/blocks outlined above in a different order. To illustrate, a user may choose to change from the third mode of operation to the first mode of operation, the fourth mode to the second mode, or any combination therebetween. Moreover, the individual steps/blocks illustrated in FIG. 14 may include multiple sub-steps that may be performed in various sequences as appropriate to the individual step. Furthermore, additional steps/blocks may be added or removed depending on the particular applications. One of ordinary skill in the art would recognize and appreciate many variations, modifications and alternatives of the process.

Figure 15:
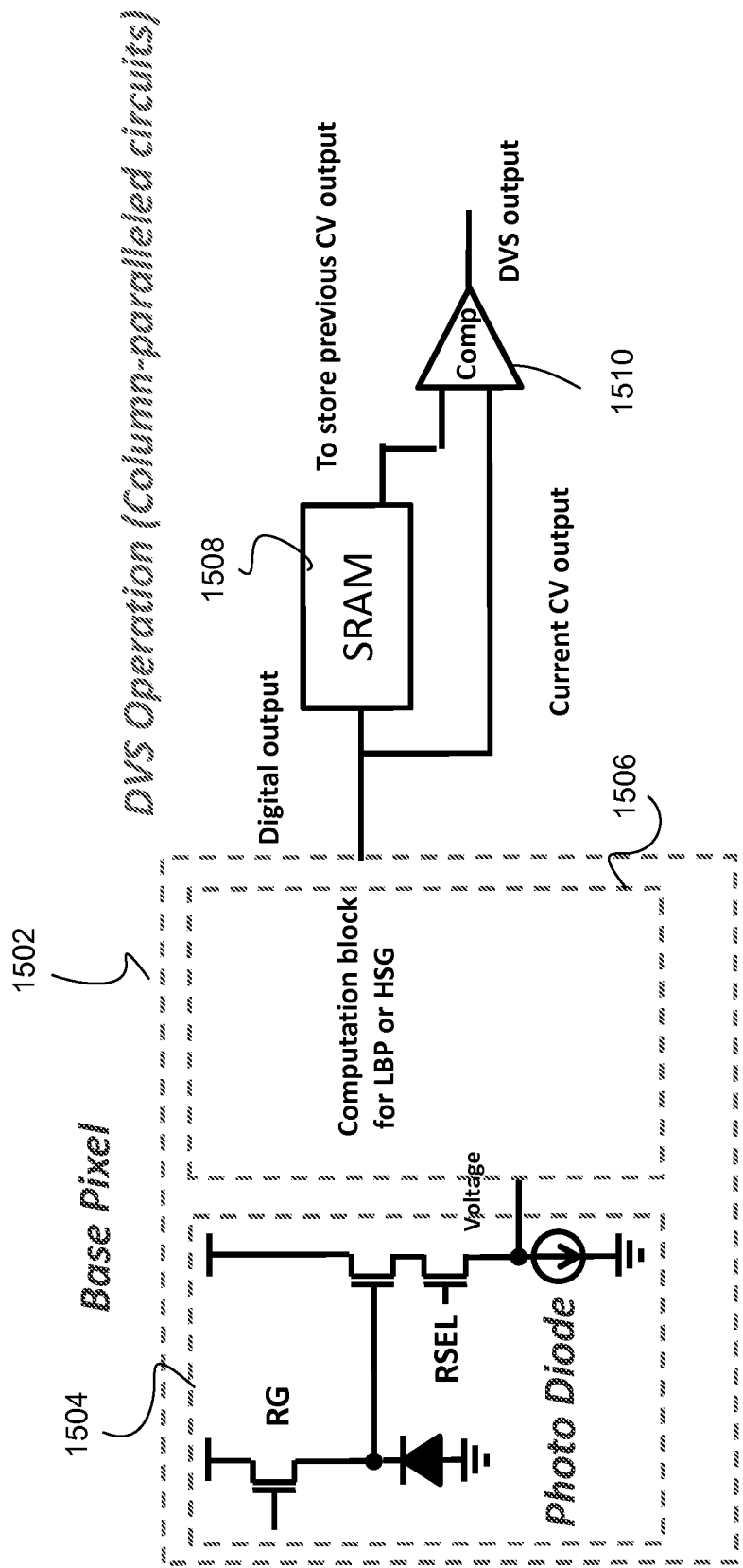
FIG. 15 illustrates an example implementation of circuitry and modules for a sensor, according to certain aspects of the disclosure.
Figure 17:
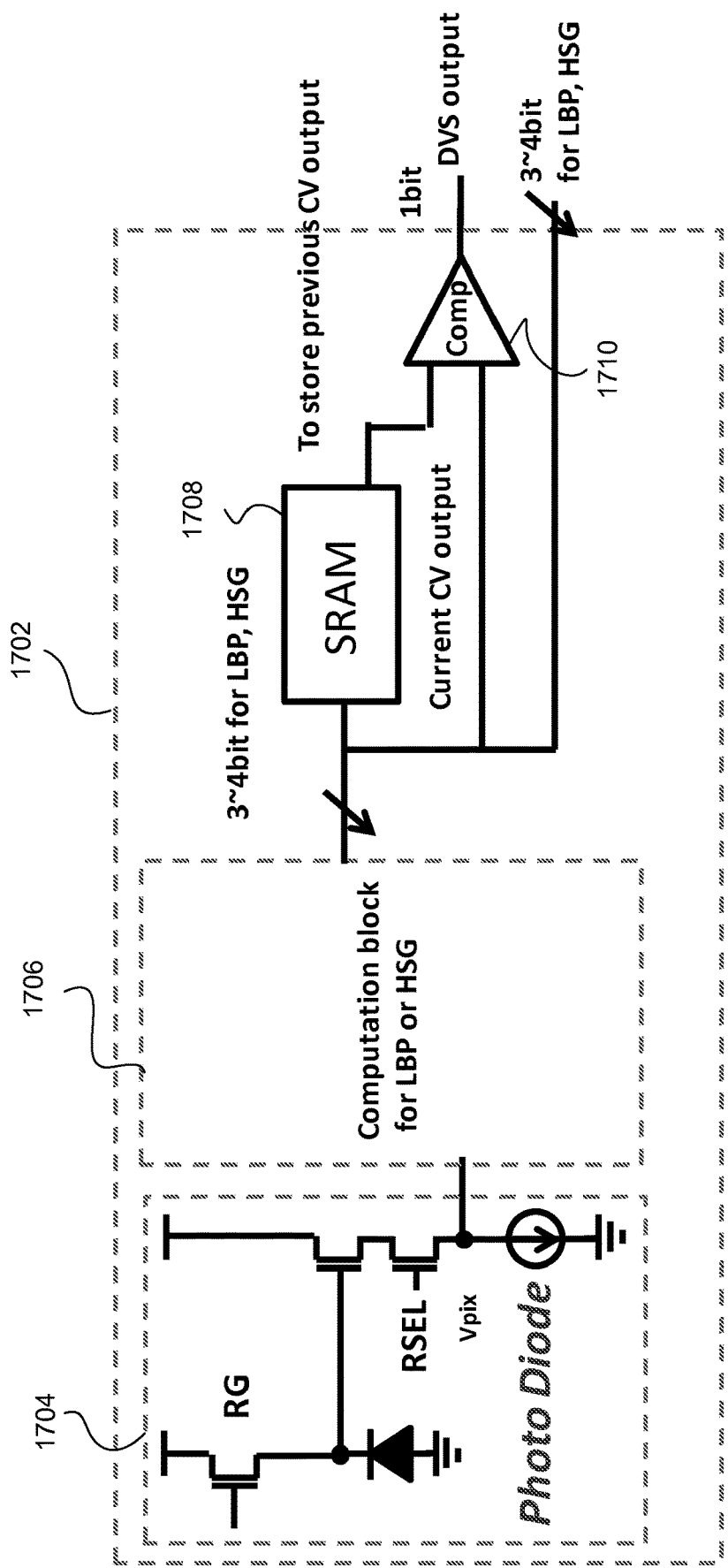
FIG. 17 illustrates another example implementation of the sensor apparatus for performing certain aspects of the disclosure.
Figure 18:
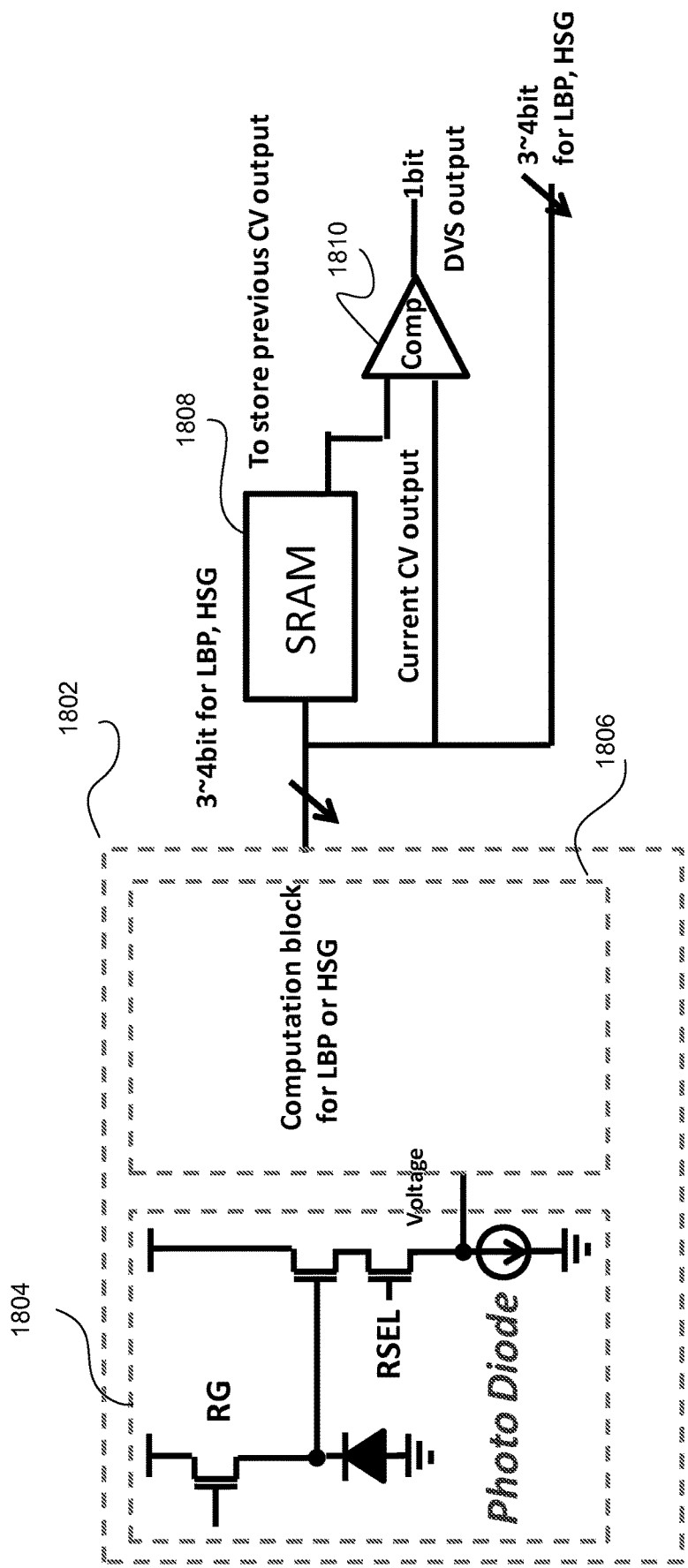
FIG. 18 illustrates another example implementation of the sensor apparatus for performing certain aspects of the disclosure.

FIG. 15, FIG. 17 and FIG. 18 are example configurations for calculating CV features prior to performing DVS operations, as described with respect to FIG. 13.

FIG. 15 illustrates an example implementation of circuitry and modules for a sensor, according to certain aspects of the disclosure. As shown in FIG. 15, the pixel 1502 may include sensory circuitry 1504 (e.g., photodiode) and the CV circuitry 1506. The Event detection module may be implemented as on-chip sensor circuitry and comprise column-parallel circuits (SRAM 1508 and comparator 1510) for checking the temporal difference between any two frames. Although, an SRAM cell 1508 is shown in FIG. 15, any other type of volatile or non-volatile memory may be used. In a digital implementation of the Event detection module, analog capacitors may be replaced with digital buffers and analog comparators may be replaced with digital comparators.

Figure 16B:
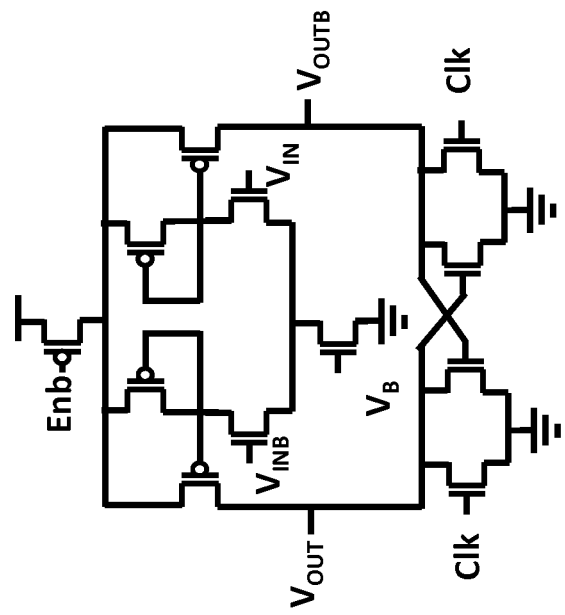
FIG. 16B provides an example implementation of a comparator that may be used in aspects of the current disclosure.
Figure 16A:
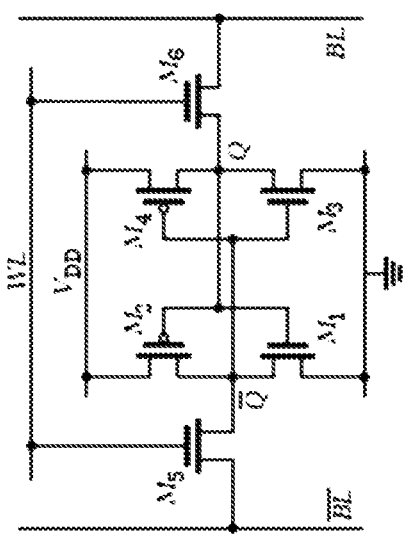
FIG. 16A provides an example implementation of an SRAM cell that may be used in aspects of the current disclosure.

FIG. 16A provides an example implementation of an static random-access memory (SRAM) cell that may be used in the Event detection module described in FIG. 15 and other figures of the current disclosure. As shown in FIG. 16A, bistable latching circuitry, with M1, M2 and M5 forming one pair and M3, M4 and M6 forming the second pair of the bistable latching circuitry. FIG. 16B provides an example implementation of a comparator for comparing previous and current values in the Event detection module in FIG. 15 and other figures of the current disclosure. The comparator may compare two voltages or currents and outputs a digital signal indicating which of the two are larger (or smaller). The comparator shown in FIG. 16B is a voltage comparator.

FIG. 17 illustrates another example implementation of the sensor apparatus 1702 for performing certain aspects of the disclosure. As shown in FIG. 17, the CV module 1706 and the Event detection circuitry are both implemented inside the pixel, configured to perform in-pixel CV and DVS processing. The CV module may generate LBP or HSG labels. In FIG. 17, the CV operations are performed first, followed by the DVS operations. The DVS operations may be performed in the digital domain and an event may be generated based on feature detection. The Event detection circuitry may implement the SRAM 1708 or a similarly suitable memory for storing the previous CV output. The previous and current CV output may be compared by the comparator 1710 for generating the DVS event. The DVS feature event may be provided to an application processor 406, along with the CV information for further processing.

FIG. 18 illustrates another example implementation of the sensor apparatus 1802 for performing certain aspects of the disclosure. As shown in FIG. 18, the sensory circuitry 1804 (e.g., photodiode) and the CV module 1806 is implemented inside the sensor apparatus 1802 (i.e., pixel) and the CV features are detected in-pixel. The Event detection module is implemented as on-chip sensor circuitry and is implemented in column parallel circuits. In FIG. 18, the CV operations are performed first, followed by the DVS operations. The DVS operations may be performed in the digital domain and an event may be generated based on feature detection. The Event detection module may implement the SRAM 1808 or a similarly suitable memory for storing the previous CV output. The previous and current CV output may be compared by the comparator 1810 for generating the DVS event. The DVS feature event may be provided to the processor, along with the CV information for further processing.

Although, many of the examples described above disclose performing the DVS (i.e., event detection) and CV operations in circuitry, in some implementations, one or both of those operations may be performed in software or firmware on a processor in the digital domain without deviating from the scope of the invention. For example, in certain implementations, these operations may be performed in the digital domain in a dedicated CV processing module 404.

According to one or more aspects, any and/or all of the apparatus modules, circuitry, methods and/or method steps described in FIGS. 1-18 herein may be implemented by and/or in sensor apparatus, such as a vision sensor apparatus. In one embodiment, one or more of the method steps discussed may be implemented by a sensing element and processing logic of the sensor apparatus, such as the CV circuitry, Event detection module or any other circuitry. Additionally, or alternatively, any and/or all of the methods and/or method steps described herein may be implemented in computer-readable instructions, such as computer-readable instructions stored on a computer-readable medium, such as the memory, storage or another computer-readable medium.

Figure 19:
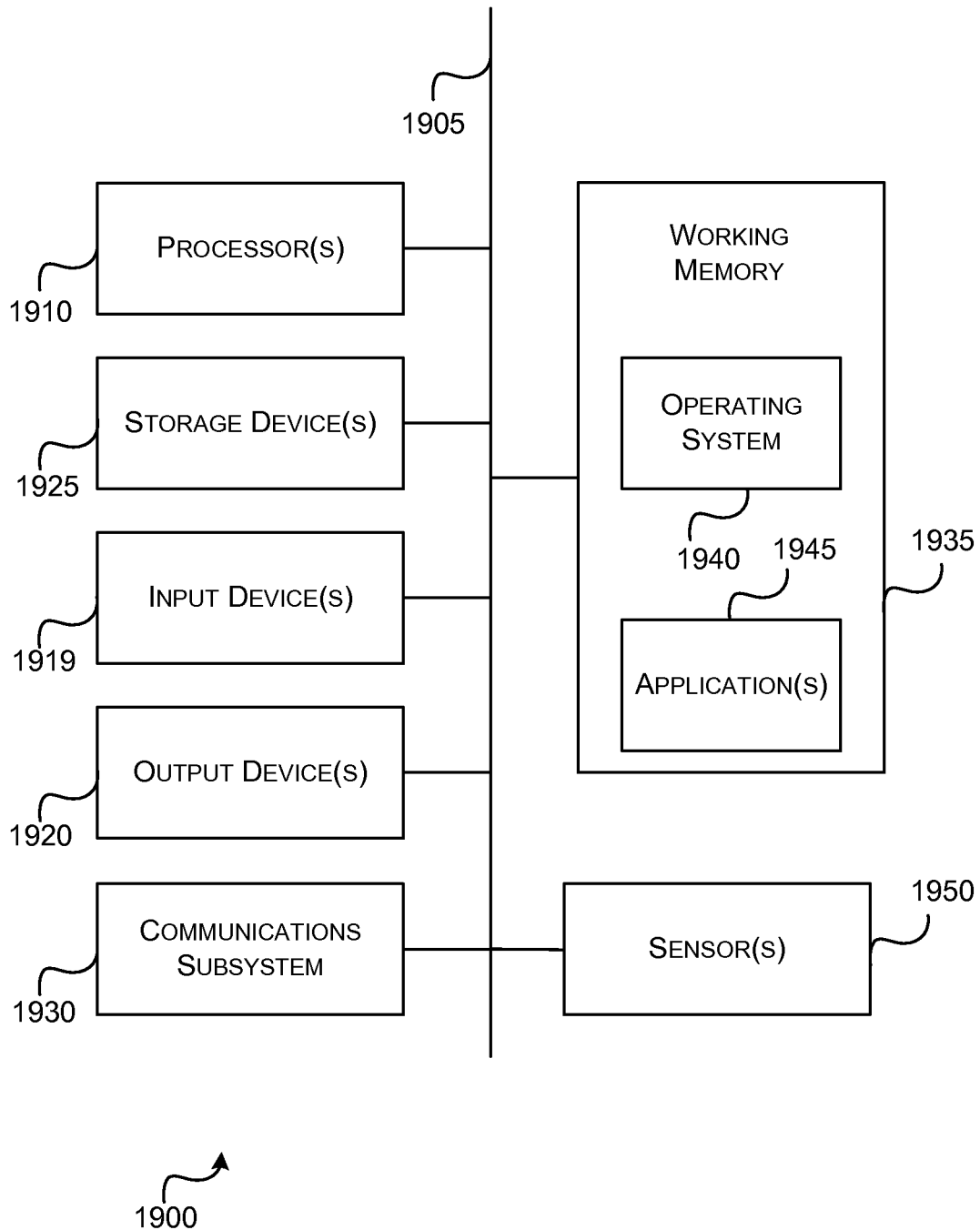
FIG. 19 illustrates an example of a computing system in which one or more embodiments may be implemented.

FIG. 19 illustrates an example computing device incorporating parts of the device and sensor 100 employed in practicing embodiments of the invention. For example, computing device 1900 may represent some of the components of a mobile device or any other computing device. Examples of a computing device 1900 include, but are not limited to, desktops, workstations, personal computers, supercomputers, video game consoles, tablets, smart phones, laptops, netbooks, or other portable devices. FIG. 19 provides a schematic illustration of one embodiment of a computing device 1900 that may perform the methods provided by various other embodiments, as described herein, and/or may function as the host computing device, a remote kiosk/terminal, a point-of-sale device, a mobile multifunction device, a set-top box and/or a computing device. FIG. 19 is meant only to provide a generalized illustration of various components, any or all of which may be utilized as appropriate. FIG. 19, therefore, broadly illustrates how individual system elements may be implemented in a relatively separated or relatively more integrated manner.

The computing device 1900 is shown comprising hardware elements that may be electrically coupled via a bus 1905 (or may otherwise be in communication, as appropriate). The hardware elements may include one or more processors 1910, including, without limitation, one or more general-purpose processors and/or one or more special-purpose processors (such as digital signal processing chips, graphics acceleration processors, and/or the like); one or more input devices 1915, which may include, without limitation, one or more cameras sensors 1950, a mouse, a keyboard and/or the like; and one or more output devices 1920, which may include, without limitation, a display unit, a printer and/or the like. Sensors 1950 module may include vision sensors, olfactory sensors and/or chemical sensors. An example sensor 100 is described in FIG. 1.

The computing device 1900 may further include (and/or be in communication with) one or more non-transitory storage devices 1925, which may comprise, without limitation, local and/or network accessible storage, and/or may include, without limitation, a disk drive, a drive array, an optical storage device, a solid-form storage device such as a random access memory ("RAM") and/or a read-only memory ("ROM"), which may be programmable, flash-updateable and/or the like. Such storage devices may be configured to implement any appropriate data storage, including, without limitation, various file systems, database structures, and/or the like.

The computing device 1900 might also include a communications subsystem 1930. The communications subsystem 1930 may include a transceiver 1950 for receiving and transmitting data or a wired and/or wireless medium. The communications subsystem 1930 may also include, without limitation, a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. The communications subsystem 1930 may permit data to be exchanged with a network (such as the network described below, to name one example), other computing devices, and/or any other devices described herein. In many embodiments, the computing device 1900 will further comprise a non-transitory working memory 1935, which may include a RAM or ROM device, as described above.

The computing device 1900 may comprise software elements, shown as being currently located within the working memory 1935, including an operating system 1940, device drivers, executable libraries, and/or other code, such as one or more application programs 1945, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions may be used to configure and/or adapt a general purpose computer (or other device) to perform one or more operations in accordance with the described methods.

A set of these instructions and/or code might be stored on a computer-readable storage medium, such as the storage device(s) 1925 described above. In some cases, the storage medium might be incorporated within a computing device, such as computing device 1900. In other embodiments, the storage medium might be separate from a computing device (e.g., a removable medium, such as a compact disc), and/or provided in an installation package, such that the storage medium may be used to program, configure and/or adapt a general purpose computer with the instructions/code stored thereon. These instructions might take the form of executable code, which is executable by the computing device 1900 and/or might take the form of source and/or installable code, which, upon compilation and/or installation on the computing device 1900 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices 1900 such as network input/output devices may be employed.

Some embodiments may employ a computing device (such as the computing device 1900) to perform methods in accordance with the disclosure. For example, some or all of the procedures of the described methods may be performed by the computing device 1900 in response to processor 1910 executing one or more sequences of one or more instructions (which might be incorporated into the operating system 1940 and/or other code, such as an application program 1945) contained in the working memory 1935. Such instructions may be read into the working memory 1935 from another computer-readable medium, such as one or more of the storage device(s) 1925. Merely by way of example, execution of the sequences of instructions contained in the working memory 1935 might cause the processor(s) 1910 to perform one or more procedures of the methods described herein.

The terms "machine-readable medium" and "computer-readable medium," as used herein, refer to any medium that participates in providing data that causes a machine to operate in a specific fashion. In an embodiment implemented using the computing device 1900, various computer-readable media might be involved in providing instructions/code to processor(s) 1910 for execution and/or might be used to store and/or carry such instructions/code (e.g., as signals). In many implementations, a computer-readable medium is a physical and/or tangible storage medium. Such a medium may take many forms, including, but not limited to, non-volatile media, volatile media, and transmission media. Non-volatile media include, for example, optical and/or magnetic disks, such as the storage device(s) 1925. Volatile media include, without limitation, dynamic memory, such as the working memory 1935. Transmission media include, without limitation, coaxial cables, copper wire and fiber optics, including the wires that comprise the bus 1905, as well as the various components of the communications subsystem 1930 (and/or the media by which the communications subsystem 1930 provides communication with other devices). Hence, transmission media may also take the form of waves (including, without limitation, radio, acoustic and/or light waves, such as those generated during radio-wave and infrared data communications). In an alternate embodiment, event-driven components and devices, such as cameras, may be used, where some of the processing may be performed in analog domain.

Common forms of physical and/or tangible computer-readable media include, for example, a floppy disk, a flexible disk, hard disk, magnetic tape, or any other magnetic medium, a CD-ROM, any other optical medium, punch-cards, papertape, any other physical medium with patterns of holes, a RAM, a PROM, EPROM, a FLASH-EPROM, any other memory chip or cartridge, a carrier wave as described hereinafter, or any other medium from which a computer may read instructions and/or code.

Various forms of computer-readable media may be involved in carrying one or more sequences of one or more instructions to the processor(s) 1910 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computing device 1900. These signals, which might be in the form of electromagnetic signals, acoustic signals, optical signals and/or the like, are all examples of carrier waves on which instructions may be encoded, in accordance with various embodiments of the invention.

The communications subsystem 1930 (and/or components thereof) generally will receive the signals, and the bus 1905 then might carry the signals (and/or the data, instructions, etc., carried by the signals) to the working memory 1935, from which the processor(s) 1910 retrieves and executes the instructions. The instructions received by the working memory 1935 may optionally be stored on a non-transitory storage device 1925 either before or after execution by the processor(s) 1910.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

What is claimed is:

1. A method, comprising:
    comparing a previous localized computer vision (CV) feature associated with a subject sensor element of a sensor element array computed using CV feature computation hardware and a current localized CV feature associated with the subject sensor element computed using the CV feature computation hardware, wherein, for both the previous localized CV feature and the current localized CV feature, the CV feature computation hardware computes the respective CV feature using a respective reading from the subject sensor element and a respective reading from a neighboring sensor element to the subject sensor element, and wherein:
        the sensor element array comprises a plurality of sensor elements, the plurality of sensor elements arranged along at least a first dimension and a second dimension of the sensor element array,
        a pixel comprises the subject sensor element and in-pixel circuitry, and
        the CV feature computation hardware is implemented as part of the in-pixel circuitry;
    generating, based on the comparing, an event associated with the subject sensor element, the event comprising a location of the subject sensor element and a feature payload comprising a plurality of bits representing the computed current localized CV feature associated with the subject sensor element; and
    sending the event to a processor.

2. The method of claim 1, wherein the localized CV feature comprises a local binary pattern (LBP) label or a variation of the LBP label.

3. The method of claim 1, wherein the localized CV feature comprises a histogram of signed gradient (HSG) label.

4. The method of claim 1, wherein the sensor element array is a vision sensor and each of the plurality of sensor elements of the sensor element array comprises at least one photodiode.

5. The method of claim 1, wherein the event is generated using dynamic vision sensor (DVS) circuitry.

6. A vision sensor comprising:
    a sensor element array comprising a plurality of sensor elements, the plurality of sensor elements arranged along at least a first dimension and a second dimension of the sensor element array, each of the plurality of sensor elements capable of generating sensor readings based on light incident upon the sensor elements;
    a computer vision (CV) feature computation hardware configured to compute a previous localized CV feature associated with a subject sensor element of the sensor element array and a current localized CV feature associated with the subject sensor element, wherein, for both the previous localized CV feature and the current localized CV feature, the CV feature computation hardware computes the respective CV feature using a respective reading from the subject sensor element and a respective reading from a neighboring sensor element to the subject sensor element, and wherein:
        a pixel comprises the subject sensor element and in-pixel circuitry, and
        the CV feature computation hardware is implemented as part of the in-pixel circuitry;
    a comparator configured to compare the previous localized CV feature associated with the subject sensor element and the current localized CV feature associated with the subject sensor element; and
    the CV feature computation hardware further configured to generate, based on the comparison by the comparator, an event associated with the subject sensor element, the event comprising a location of the subject sensor element and a feature payload comprising a plurality of bits representing the computed current localized CV feature associated with the subject sensor element, and send the event to a processor.

7. The vision sensor of claim 6, wherein the localized CV feature comprises a local binary pattern (LBP) label or a variation of the LBP label.

8. The vision sensor of claim 6, wherein the localized CV feature comprises a histogram of signed gradient (HSG) label.

9. The vision sensor of claim 6, wherein each of the plurality of sensor elements of the sensor element array comprises at least one photodiode.

10. The vision sensor of claim 6, wherein the event is generated using dynamic vision sensor (DVS) circuitry.

11. An apparatus, comprising:
    means for comparing a previous localized computer vision (CV) feature associated with a subject sensor element of a sensor element array computed using CV feature computation hardware and a current localized CV feature associated with the subject sensor element computed using the CV feature computation hardware, wherein, for both the previous localized CV feature and the current localized CV feature, the CV feature computation hardware computes the respective CV feature using a respective reading from the subject sensor element and a respective reading from a neighboring sensor element to the subject sensor element, and wherein:

the sensor element array comprises a plurality of sensor elements, the plurality of sensor elements arranged along at least a first dimension and a second dimension of the sensor element array, a pixel comprises the subject sensor element and in-pixel circuitry, and the CV feature computation hardware is implemented as part of the in-pixel circuitry;

means for generating, based on the comparing, an event associated with the subject sensor element, the event comprising a location of the subject sensor element and a feature payload comprising a plurality of bits representing the computed current localized CV feature associated with the subject sensor element; and means for sending the event to a processor.

12. The apparatus of claim 11, wherein the localized CV feature comprises a local binary pattern (LBP) label or a variation of the LBP label.

13. The apparatus of claim 11, wherein the localized CV feature comprises a histogram of signed gradient (HSG) label.

14. The apparatus of claim 11, wherein the sensor element array is a vision sensor and each of the plurality of sensor elements of the sensor element array comprises at least one photodiode.

15. A non-transitory computer-readable storage medium, wherein the non-transitory computer-readable storage medium comprises instructions executable by a dedicated computer vision (CV) processing module for:

comparing a previous localized CV feature associated with a subject sensor element of a sensor element array computed using CV feature computation hardware and a current localized CV feature associated with the subject sensor element computed using the CV feature computation hardware, wherein, for both the previous localized CV feature and the current localized CV feature, the CV feature computation hardware computes the respective CV feature using a respective reading from the subject sensor element and a respective reading from a neighboring sensor element to the subject sensor element, and wherein:

the sensor element array comprises a plurality of sensor elements, the plurality of sensor elements arranged along at least a first dimension and a second dimension of the sensor element array, a pixel comprises the subject sensor element and in-pixel circuitry, and the CV feature computation hardware is implemented as part of the in-pixel circuitry;

generating, based on the comparing, an event associated with the subject sensor element, the event comprising a location of the subject sensor element and a feature payload comprising a plurality of bits representing the computed current localized CV feature associated with the subject sensor element; and sending the event to a processor.

16. The non-transitory computer-readable storage medium of claim 15, wherein the localized CV feature comprises a local binary pattern (LBP) label or a variation of the LBP label.

17. The non-transitory computer-readable storage medium of claim 15, wherein the localized CV feature comprises a histogram of signed gradient (HSG) label.

18. The non-transitory computer-readable storage medium of claim 15, wherein the sensor element array is a vision sensor and each of the plurality of sensor elements of the sensor element array comprises at least one photodiode.

* * * * *